US006337807B2

(12) United States Patent
Futatsuyama et al.

(10) Patent No.: US 6,337,807 B2
(45) Date of Patent: Jan. 8, 2002

(54) ELECTRICALLY ERASABLE AND PROGRAMMABLE SEMICONDUCTOR MEMORY

(75) Inventors: Takuya Futatsuyama, Yokohama; Kenichi Imamiya, Tokyo; Tamio Ikehashi, Kamakura, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/749,737

(22) Filed: Dec. 28, 2000

(30) Foreign Application Priority Data

Dec. 28, 1999 (JP) .......................................... 11-375482

(51) Int. Cl.[7] .............................................. G11C 16/04
(52) U.S. Cl. ............................. 365/185.17; 365/185.18
(58) Field of Search ........................ 365/185.17, 185.18, 365/185.23, 185.28, 185.29

(56) References Cited

U.S. PATENT DOCUMENTS 5,075,890 A * 12/1991 Itoh et al. ............... 365/189.09
5,696,717 A * 12/1997 Koh ....................... 365/185.22
5,708,606 A * 1/1998 Tanzawa et al. ........ 365/185.17
5,841,721 A * 11/1998 Kwon et al. ................ 365/218
5,905,691 A * 5/1999 Tanzawa et al. ............ 365/233
6,044,017 A * 3/2000 Lee et al. ............... 365/185.18

FOREIGN PATENT DOCUMENTS

JP          5-234392          9/1993

* cited by examiner

Primary Examiner—Richard Elms
Assistant Examiner—Anh Phung
(74) Attorney, Agent, or Firm—Banner & Witcoff, Ltd.

(57) ABSTRACT

A first transistor is connected between the gates of select transistors connected to two ends of a memory cell and a select line control circuit. A first gate line is connected to the gate of the first transistor. A first voltage control circuit controls the voltage of the first gate line to turn on or off the first transistor. A second transistor is connected between the control gate of the memory cell and a word line control circuit. A second gate line separated from the first gate line is connected to the gate of the second transistor. A second voltage control circuit controls the voltage of the second gate line to turn on or off the second transistor.

39 Claims, 23 Drawing Sheets

FIG. 20

| | DATA PROGRAMMING | | READ STANDBY DATA READ | | | OTHERS | |
|---|---|---|---|---|---|---|---|
| | S1 | G1 | S1 | S1 | G1 | S1 | G1 |
| SELECTED BLOCK | Vdd | Vpp(~20V)+α | Vdd | Vdd | Vdd | Vdd | Vdd |
| UNSELECTED BLOCK | 0V | 0V | 0V | 0V | 0V | 0V | 0V |

FIG. 25

| | DATA PROGRAMMING | | READ STANDBY DATA READ | | | OTHERS | |
|---|---|---|---|---|---|---|---|
| | DEC2 | G1 | DEC2 | DEC2 | G1 | DEC2 | G1 |
| SELECTED BLOCK | Vsg | Vpp(~20V)+α | Vsg | Vsg | Vsg | Vsg | Vsg |
| UNSELECTED BLOCK | 0V | 0V | 0V | 0V | 0V | 0V | 0V |

ELECTRICALLY ERASABLE AND PROGRAMMABLE SEMICONDUCTOR MEMORY

CROSS-REFERENCE TO RELATED APPLICATIONS

This application is based upon and claims the benefit of priority from the prior Japanese Patent Application No. 11-375482, filed Dec. 28, 1999, the entire contents of which are incorporated herein by reference.

BACKGROUND OF THE INVENTION

The present invention relates to a semiconductor memory and, more particularly, to an electrically erasable and programmable ROM (to be referred to as an EEPROM hereinafter) having NAND memory cells.

EEPROMs are conventionally known as one type of semiconductor memories. Of these EEPROMs, a NAND cell type EEPROM in which a plurality of memory cells are connected in series to form a NAND memory cell is attracting attention as a device which can be highly integrated.

One memory cell in this NAND cell type EEPROM has a MOSFET structure in which a floating gate (a charge storage layer) and a control gate are stacked via an insulating film on a semiconductor substrate. A plurality of such memory cells are connected in series to form a NAND cell such that adjacent memory cells share the source and drain. Such NAND cells are arrayed in a matrix manner to form a memory cell array.

Memory cell arrays are integrated in a p-type-well formed on a p-type-substrate. An n-type-well is first formed on the p-type-substrate, and then the p-type-well for integrating memory cell arrays is formed in this n-type-well.

Drains on the one-end side of a plurality of memory cell arrays arranged in the column direction are connected together to a bit line via select transistors. Sources on the other-end side are connected to a common source line (reference voltage line) via select transistors. The control gates of memory cell transistors are connected to word lines. The gates of the select transistors are connected to select lines.

The operation of this NAND EEPROM will be described below by taking a device in which n-channel transistors are used as memory cell transistors as an example.

Data programming is performed as follows. Data is written in turn from a memory cell farthest from the bit line. A high voltage Vpp (about 20 V) is applied to the control gate of a selected memory cell. An intermediate voltage VppM (about 10 V) is applied to the control gates of memory cells and the gate of the select transistor closer to the bit line than the selected memory cell. The bit line is given a predetermined voltage in accordance with the data, e.g., given 0 V when the data is "0" and an intermediate voltage when the data is "1". The power supply voltage is applied to the select line on the bit line side, and the ground voltage is applied to the select line on the source line side. In this state, the voltage of the bit line is transmitted to the drain of the selected memory cell through the select transistor and unselected memory cells.

When 0 V is applied to the bit line (when write data exists, i.e., when data is "1"), this voltage is transmitted to the drain of the selected memory cell to apply a high electric field between the gate and drain of the selected memory cell. Hence, electrons are injected (tunnel-injected) from the drain (substrate) into the floating gate. Consequently, the threshold voltage of the selected memory cell shifts in the positive direction.

On the other hand, when the intermediate voltage is applied to the bit line (when no data to be written exists, i.e., when data is "1"), no electron injection occurs, so the threshold voltage remains unchanged, i.e., negative.

Data erase is performed as follows.

First, in a selected NAND cell block, the ground voltage is applied to the control gates of all memory cells in the block. In an unselected NAND cell block, the control gates of all memory cells in the block and all select lines, bit lines, and source lines are floating. Subsequently, a high erase voltage (about 20 V) is applied to p- and n-type-wells. Consequently, electrons are emitted into the wells from the floating gates of the memory cells in the selected block, erasing the data in the memory cells in the block.

In this state, the control gates of the memory cells, select lines, bit lines, and source lines in the unselected NAND cell block raise their voltages close to the erase voltage by capacitive coupling. For example, the voltage of the select line rises close to the erase voltage (about 20 V) by the capacitive coupling of the gate capacitance of the select transistor with the other parasitic capacitance in the select line.

Data read is performed as follows.

First, the control gate of a selected memory cell is set at 0 V, and the control gates of other memory cells and the select lines are set at a read voltage (about 3.5 V), thereby turning on unselected memory cell transistors and select transistors. Each data of "1" and "0" is discriminated by sensing whether a current flows or not into the bit line respectively.

As described above, different voltages are supplied to the select lines and the word lines connected to the control gates in the data programming, erase, and read modes.

FIG. 1 shows a circuit configuration for supplying voltages to select lines and word lines of NAND cells (of n-th blocks).

Referring to FIG. 1, transistors MN1-0 to MN1-19 are high-breakdown-voltage transistors having a thick gate insulating film. They permit a high voltage to be applied to their nodes. Portions R1 to Rn enclosed by the broken lines indicate row selecting means (row decoders) of blocks C1 to Cn. These blocks C1 to Cn represent memory cell arrays in these blocks. For the sake of simplicity, only one bit line is shown in FIG. 1. It is appreciated that multiple bit lines exist and are known in the art. The circuit configuration will be explained by using the circuit of the first block.

Memory cells MC1 to MC16 are connected in series. One end of a current path of a select transistor SD1 is connected to the drain of the memory cell MC1. One end of a current path of a select transistor SS1 is connected to the source of the memory cell MC16. The other end of the current path of the select transistor SD1 is connected to a bit line BL. The other end of the current path of the select transistor SS1 is connected to a source line SL.

The gate of the select transistor SD1 is connected to a select line SGD1. The gate of the select transistor SS1 is connected to a select line SGS1. Also, the gates of the memory cells MC1 to MC16 are connected to word lines WL1-1 to WL1-16, respectively.

The select line SGD1, which controls select transistor SD1 as it is connected to the bit line BL, is connected to one end of a current path of a transfer transistor MN1-0. The other end of this current path is connected to a select line control circuit 51 via a select line SGD. Each of the word lines WL1-1 to WL1-16 is connected to one end of a current path of a corresponding one of transfer transistors MN1-1 to MN1-16. The other end of each of these current paths is connected to a corresponding one of word line control circuits 52-1 to 52-16 via a corresponding one of control gate lines CG1 to CG16. Furthermore, the select line SGS1, which control select transistor SS1 as it is connected to the source line SL, is connected to one end of a current path of a transfer transistor MN1-17. The other end of this current path is connected to a select line control circuit 53 via a select line SGS.

The select line control circuit 51 supplies a voltage to the select line SGD. The word line control circuits 52-1 to 52-16 supply a voltage to the control gate lines CG1 to CG16. The select line control circuit 53 supplies a voltage to the select line SGS.

The gates of the transfer transistors MN1-0 to MN1-17 are connected together to a gate line G1, and this gate line G1 is connected to a high-voltage transfer circuit 54-1. A high voltage generator 55 supplies a voltage equal to or higher than a power supply voltage Vcc to the high-voltage transfer circuit 54-1 via a transfer line LPIN. An address signal ADDRESS is input to a NAND gate circuit NA51-1. The output from this NAND gate circuit NA51-1 is supplied as a decode signal DEC1 of the address signal to the high-voltage transfer circuit 54-1 via an inverter IV51-1.

The source of a transistor MN1-18 is connected to the select line SGD1. The source of a transistor MN1-19 is connected to the select line SGS1. The drains of these transistors MN1-18 and MN1-19 are connected to a selective driving circuit 56 via a selecting line SGDS. The gates of the transistors MN1-18 and MN1-19 are supplied with the inverted output of the address decode signal, which is the output from the NAND gate circuit NA51-1. In data erase, the selective driving circuit 56 supplies a threshold drop voltage of the power supply voltage VCC to the select lines SGD1 and SGS1. In other cases, the selective driving circuit 56 supplies a ground voltage Vss to the select lines SGD1 and SGS1.

When the block C1 is selected, the high-voltage transfer circuit 54-1 supplies to the gate line G1 a voltage equal to or higher than the power supply voltage and sufficient to turn on the transfer transistors MN1-0 to MN1-17, in accordance with each of the data programming, erase, and read modes. Accordingly, the transfer transistor MN1-0 transfers the output voltage from the select line control circuit 51 to the select line SGD1. The transfer transistors MN1-1 to MN1-16 transfer the output voltages from the word line control circuits 52-1 to 52-16 to the word lines WL1-1 to WL1-16, respectively. Furthermore, the transfer transistor MN1-17 transfers the output voltage from the select line control circuit 53 to the select line SGS1. When the block C1 is not selected, the high-voltage transfer circuit 54-1 applies the ground voltage to the gate line G1. Consequently, the transfer transistors MN1-0 to MN1-17 are cut off.

High-breakdown-voltage transistors are used as the transfer transistors MN1-0 to MN1-17, MN1-18, and MN1-19 because in data erase the voltage of the sources (the select lines or the word lines of unselected blocks) of these transistors rise to about the erase voltage (about 20 V) by capacitive coupling.

FIGS. 2 to 4 are timing charts showing the operations of data programming, read, and erase in the circuit shown in FIG. 1.

Different voltages, i.e., about 20 V for data programming, about 3.5 V for data read, and the power-supply voltage for data erase, are set in the high-voltage source circuit 55. These different voltages are supplied from the high-voltage source circuit 55 to the high-voltage transfer circuit 54-1. This high-voltage transfer circuit 54-1 is controlled by the address decode signal DEC1. When the block C1 is selected, the output from the high-voltage transfer circuit 54-1 is supplied to the gate electrodes of the transfer transistors MN1-0 to MN1-17 via the gate line G1. Consequently, the output voltage from the select line control circuit 51 is transferred to the select line SGD1, and the output voltage from the select line control circuit 53 is transferred to the select line SGS1. Furthermore, the output voltages from the word line control circuits 52-1 to 52-16 are transferred to the word lines WL1-1 to WL1-16, respectively.

When the block C1 is not selected, the high-voltage transfer circuit 54-1 supplies the ground voltage to the gate line G1. Accordingly, the transfer transistors MN1-0 to MN1-17 are cut off, and the select lines SGD1 and SGS1 and the word lines WL1-1 to WL1-16 are floating. In this state, the transfer transistors MN1-18 and MN1-19 are turned on, and the output voltage of the selective driving circuit 56 is supplied to the select lines SGD1 and SGS1.

As has been described above, when the block C1 is selected in the semiconductor memory shown in FIG. 1, different voltages are supplied to the select lines SGD1 and SGS1 and the word lines WL1-1 to WL1-16 in accordance with the data programming, read, and erase modes. The transfer transistors MN1-0 to MN1-17 transfer the voltages to the select lines SGD1 and SGS1 and the word lines WL1-1 to WL1-16. The gate line G1 is connected to the gate electrodes of these transfer transistors MN1-0 to MN1-17. When the block C1 is selected, different voltages are supplied to the gate line G1 in accordance with the data programming, read, and erase modes. On the other hand, if the block C1 is not selected, the ground voltage is supplied to the gate line G1.

Accordingly, when this block C1 switches from an unselected to a selected state and from a selected to an unselected state in these modes, charging for raising from the ground voltage to the operating voltages of these modes and discharging for lowering these operating voltages to the ground voltage are repeatedly performed for the gate line G1. This increases the charge/discharge time of the gate line G1 and consumes a current. Also, the gate electrodes of the transistors for transferring voltages to the select lines SGD1 and SGS1 and the gate electrodes of the transistors for transferring voltages to the word lines WL1-1 to WL1-16 are connected together to the gate line G1. Hence, to transfer a voltage from the select line SGD to the select line SGD1 or from the select line SGS to the select line SGS1, a voltage more than necessary must be supplied.

Furthermore, in data erase the erase voltage (about 20 V) is applied to the substrate or the well. Since this raises the voltages of the select lines SGD1 and SGS1 in a floating state to about the erase voltage (about 20 V) by capacitive coupling, high-breakdown-voltage transistors (low-current-driven transistors) are used as the transfer transistors MN1-0 to MN1-17. In data read and write, the gates of the transfer transistors MN1-0 to MN1-17 are boosted whenever the NAND cell block is selected, so it takes a long time for these transfer transistors to turn on. Also, the transfer transistors MN1-0 to MN1-17 are slow in operation because they are high-breakdown-voltage transistors.

Accordingly, voltages cannot be rapidly transferred to the select lines SGD1 and SGS1 and the word lines WL1-1 to WL1-16. For example, in a 256-Mbit NAND cell type EEPROM, the data read time is determined by the resistance of a transfer transistor connected to a select line, i.e., by the size of the transistor.

Additionally, high-breakdown-voltage transistors (low-current-driven transistors) are also used in the select line control circuits 51 and 53, and these select line control circuits are shared by NAND cells in all blocks. This increases the length of wiring to the transfer transistors MN1-0 to MN1-17, resulting in a large wiring delay. Hence, voltages cannot be rapidly supplied to the select lines SGD1 and SGS1.

BRIEF SUMMARY OF THE INVENTION

The present invention has been made in consideration of the above situation, and has as its object to provide a semiconductor memory capable of suppressing current consumption, rapidly supplying voltages to the gates (select lines) of select transistors, and increasing a access time required for reading data.

To achieve the above object, a semiconductor memory device according to a first aspect of the present invention comprises a memory cell for storing information, a select transistor connected to the memory cell, a select circuit for outputting a first signal for selecting the memory cell, a select line connected the gate of the select transistor, a select line control circuit for driving the select transistor, the select line control circuit outputting a second signal in accordance with the first signal and a operation mode of the memory cell, a first transistor having a current path whose one end is connected to the select line control circuit and other end is connected to the gate of the select transistor, the first transistor transferring the second signal to the select line, a first gate line connected to the gate of the first transistor, a first voltage control circuit for supplying a voltage to the first gate line to turn on or off the first transistor, a word line control circuit for driving a word line connected to the gate of the memory cell, the word line control circuit outputting a third signal, a second transistor having a current path whose one end is connected to the word line control circuit and other end is connected to the word line, the second transistor transferring the third signal to the word line, a second gate line connected to the gate of the second transistor, the second gate line being disconnected from the first gate line, and a second voltage control circuit for supplying a voltage to the second gate line to turn on or off the second transistor.

To achieve the above object, a semiconductor memory device according to a second aspect of the present invention comprises a memory cell array in which memory cell blocks are arrayed in a column direction, each of the memory cell blocks being formed by arranging memory cell units in a row direction, and each of the memory cell units being formed by connecting a select transistor to a memory cell for storing information, a select circuit for outputting a first signal for selecting each of the memory cell blocks, a select line connected the gate of the select transistor, a select line control circuit for driving the select transistor, the select line control circuit outputting a second signal in accordance with the first signal and a operation mode of the memory cell, a first transistor having a current path whose one end is connected to the select line control circuit and other end is connected to the gate of the select transistor, the first transistor transferring the second signal to the select line, a first gate line connected to the gate of the first transistor, a first voltage control circuit for supplying a voltage to the first gate line to turn on or off the first transistor, a word line control circuit for driving a word line connected to the gate of the memory cell in the memory cell unit, the word line control circuit outputting a third signal, a second transistor having a current path whose one end is connected to the word line control circuit and other end is connected to the word line, the second transistor transferring the third signal to the word line, a second gate line connected to the gate of the second transistor, the second gate line being disconnected from the first gate line, and a second voltage control circuit for supplying a voltage to the second gate line to turn on or off the second transistor.

To achieve the above object, a semiconductor memory device according to a third aspect of the present invention comprises a memory cell array in which memory cell units are arrayed in a matrix manner, each of the memory cell units being formed by connecting select transistors to two ends of one memory cell transistor for storing information, a bit line being connected to a select transistor connected to one end of the memory cell unit, and a source line being connected to a select transistor connected to the other end of the memory cell unit, a select circuit for outputting a first signal for selecting each of the memory cell units arrayed in a row direction, a select line connected each of the gates of the select transistors, a select line control circuit for driving at least one of the select transistors, the select line control circuit outputting a second signal in accordance with the first signal and a operation mode of the memory cell, a first transistor having a current path whose one end is connected to the select line control circuit and other end is connected to the gate of at least one of the select transistors, the first transistor transferring the second signal to the select line, a first gate line connected to the gate of the first transistor, a first voltage control circuit for supplying a voltage to the first gate line to turn on or off the first transistor, a word line control circuit for driving a word line connected to the gate of the memory cell in each of the memory cell units arrayed in the row direction, the word line control circuit outputting a third signal, a second transistor having a current path whose one end is connected to the word line control circuit and other end is connected to the word line, the second transistor transferring the third signal to the word line, a second gate line connected to the gate of the second transistor, the second gate line being disconnected from the first gate line, and a second voltage control circuit for supplying a voltage to the second gate line to turn on or off the second transistor.

To achieve the above object, a semiconductor memory device according to a fourth aspect of the present invention comprises a memory cell for storing information, a select transistor connected to the memory cell, a select line control circuit for driving the select transistor, a first transistor having a current path whose two ends are connected between the select line control circuit and the gate of the select transistor, a first gate line connected to the gate of the first transistor, a first voltage control circuit for supplying a voltage to the first gate line to turn on or off the first transistor, a word line control circuit for driving a word line connected to the gate of the memory cell, a second transistor having a current path whose two ends are connected between the word line control circuit and the word line, a second gate line connected to the gate of the second transistor, the second gate line being disconnected from the first gate line, and a second voltage control circuit for supplying a voltage to the second gate line to turn on or off the second transistor.

In the semiconductor memories having any of the above arrangements, the gate (first gate line) of the first transistor for transferring voltages to the gate of the select transistor is separated from the gate (second gate line) of the second transistor for transferring voltages to the control gate of the memory cell. Therefore, constant voltages can be supplied to the gate of the first transistor, and the number of times of charge/discharge of the gate of the first transistor can be reduced. Accordingly, it is possible to supply stable voltages to the gate of the first transistor connected to the select line, reduce the load on the booster circuit, reduce current consumption, and rapidly transfer voltages to the gate (select line) of the select transistor. This makes a high-speed operation, particularly a high-speed read operation feasible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 20 is a view showing input and output signals of a high-voltage transfer circuit in the semiconductor memory of the fifth embodiment;

FIG. 25 is a view showing input and output signals of a high-voltage transfer circuit in the semiconductor memory of the seventh embodiment.

DETAILED DESCRIPTION OF THE INVENTION

Figure 5:
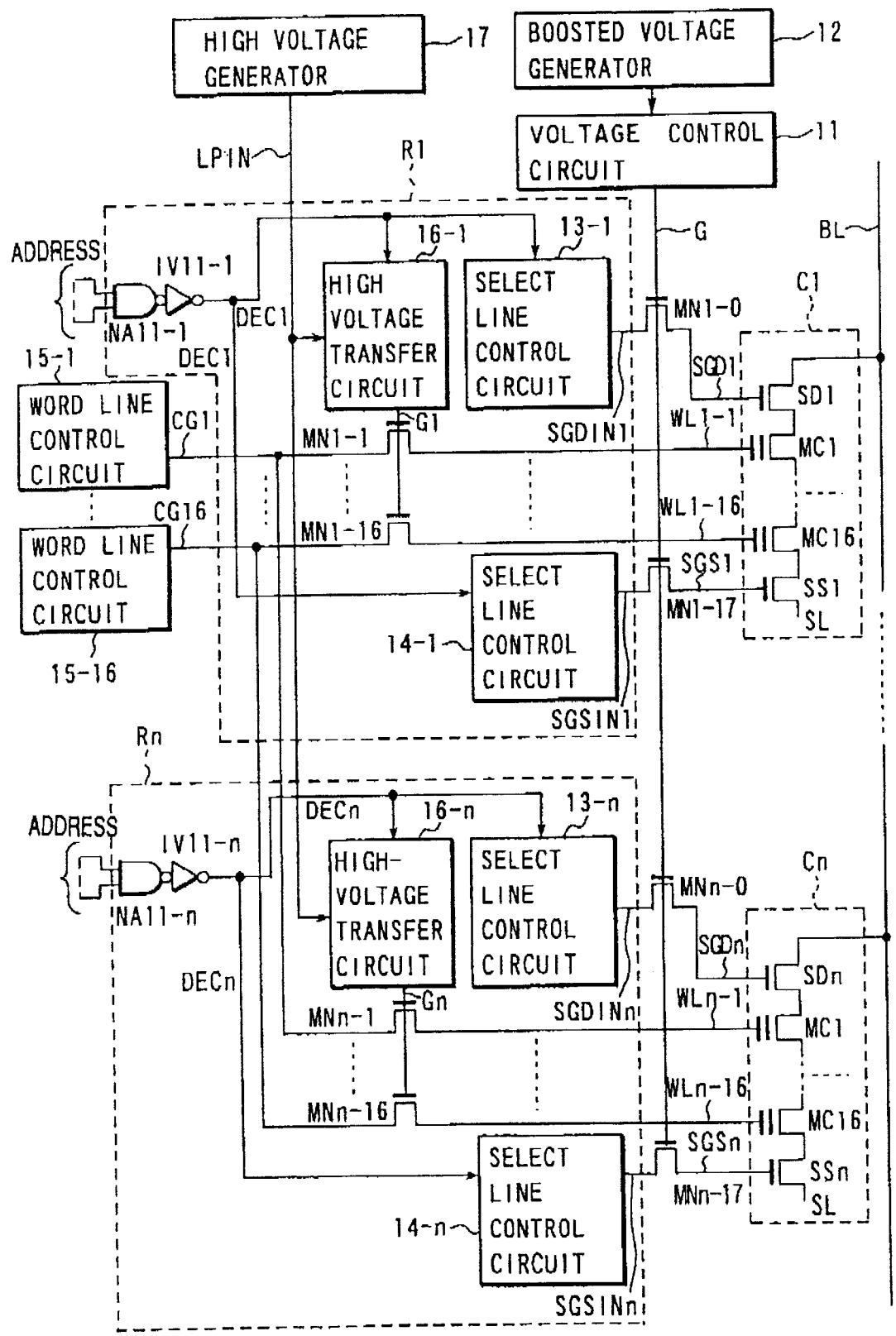
FIG. 5 is a block diagram showing the arrangement of a semiconductor memory according to a first embodiment of the present invention.

Semiconductor memories according to embodiments of the present invention will be described by taking a NAND EEPROM as an example.
First Embodiment FIG. 5 is a block diagram showing the arrangement of a semiconductor memory according to the first embodiment of the present invention. FIG. 5 shows row decoders and their control circuits of n blocks of NAND cells in a NAND cell type EEPROM. The circuit configuration will be described below by using a NAND cell, row decoder, and its control circuit in the first block.

Transistors MN1-0 to MN1-17 are high-breakdown-voltage transistors having a thick gate insulating film which allow a high voltage to be applied to their nodes. Portions R1 to Rn, enclosed with the broken lines, indicate row decoders of individual blocks. C1 to Cn denote memory cell arrays in these blocks. To simplify the explanation, only one bit line is shown in FIG. 5.

Memory cells MC1 to MC16 are connected in series. The drain of the memory cell MC1 is connected to the source of a select transistor SD1. The source of the memory cell MC16 is connected to the drain of a select transistor SS1. The drain of the select transistor SD1 is connected to a bit line BL. The source of the select transistor SS1 is connected to a source line SL.

Word lines WL1-1 to WL1-16 are connected to the gate electrodes of the memory cell transistors MC1 to MC16, respectively. A select line SGD1 is connected to the gate electrode of the select transistor SD1, which is connected to the bit line BL. A select line SGS1 is connected to the gate electrode of the select transistor SS1, which is connected to the source line SL.

The transfer transistors MN1-0 and MN1-17 are connected to the select lines SGD1 and SGS1. A gate line G is connected to the gates of the transfer transistors MN1-0 and MN1-17. The gate line G is connected to all the NAND cell blocks C1 to Cn. That is, this gate line G is connected to the gate electrodes of transfer transistors MNk-0 and MNk-17 (k=1, 2, ..., n) in all the NAND cell blocks C1 to Cn.

The gate line G is also connected, via a voltage control circuit 11, to a boosted voltage generator 12 for supplying a predetermined voltage higher than a power supply voltage Vcc to this voltage control circuit 11. In data erase or data load, the voltage control circuit 11 outputs a voltage equal to or lower than the power supply voltage to the gate line G. In other cases, the voltage control circuit 11 outputs a predetermined boosted voltage higher than the power supply voltage to the gate line G. Note that "data load" is the operation of fetching an address for performing data erase.

The source of the transfer transistor MN1-0 is connected to the select line SGD1, and the drain of the transistor MN1-0 is connected to a node SGDIN1. This node SGDIN1 is connected to a select line control circuit 13-1 for supplying a voltage to the select line SGD1. Also, the source of the transfer transistor MN1-17 is connected to the select line SGS1, and the drain of the transistor MN1-17 is connected to a node SGSIN1. This node SGSIN1 is connected to a select line control circuit 14-1 for supplying a voltage to the select line SGS1.

The sources of the transfer transistors MN1-1 to MN1-16 are connected to the word lines WL1-1 to WL1-16, respectively. Word line control circuits 15-1 to 15-16 are connected to the drains of the transfer transistors MN1-1 to MN1-16 via control gate lines CG1 to CG16, respectively. These word line control circuits 15-1 to 15-16 supply voltages to the word lines WL1-1 to WL1-16. The word line control circuits 15-1 to 15-16 are also similarly connected to the drains of the transfer transistors MNk-1 to MNk-16 (k=2, 3, ..., n) in each of the row decoders R2 to Rn via the control gate lines CG1 to CG16, respectively.

The gate electrodes of the transfer transistors MN1-1 to MN1-16 are connected together to a gate line G1, and this gate line G1 is connected to a high-voltage transfer circuit 16-1. This high-voltage transfer circuit 16-1 is supplied with a high voltage higher than the power supply voltage from a high-voltage source circuit 17 via a high-voltage transfer line LPIN. When the block C1 is selected, the high-voltage transfer circuit 16-1 supplies a sufficient voltage to the gate line G1 so that voltages supplied from the word line control circuits 15-1 to 15-16 are transferred to the word lines WL1-1 to WL1-16. When the block C1 is not selected, the high-voltage transfer circuit 16-1 supplies the ground voltage to the gate line G1. This high-voltage source circuit 17 also supplies the high voltage to a high-voltage transfer circuit 16-k (k=2, 3, ..., n) in a row decoder Rk (k=2, 3, ..., n) via the high-voltage transfer line LPIN.

An address signal ADDRESS is input to a NAND gate circuit NA11-1, and the output from this NAND gate circuit NA11-1 is supplied as a decode signal DEC1 to the select line control circuits 13-1 and 14-1 and the high-voltage transfer circuit 16-1 via an inverter IV11-1.

The operation of this semiconductor memory will be described below. Assume that the block C1 of the NAND cell blocks C1 to Cn is selected.

As described above, in a date erase operation the ground voltage is applied to the control gates of all the memory cells MC1 to MC16 in the selected block C1. Also, the control gates of all the memory cells MC1 to MC16 in the unselected blocks C2 to Cn are floating. Furthermore, all the select lines SGD1 to SGDn and SGS1 to SGSn, the bit line BL, and the source lines SL in all the blocks C1 to Cn are floating to apply a high erase voltage (about 20 V) to p- and n-type-wells. Consequently, in the memory cells MC1 to MC16 in the selected block C1, electrons in the floating gates are emitted into the wells to erase data stored in the memory cells in this block C1.

In this state, the select lines SGD1 to SGDn and SGS1 to SGSn in all the blocks C1 to Cn are floating, so the voltage of these lines rises close to the erase voltage by capacitive coupling. Hence, to prevent this high voltage of the select lines SGD1 to SGDn and SGS1 to SGSn from being transmitted to the select line control circuits 13-1 to 13-n and 14-1 to 14-n, these select lines and select line control circuits must be separated. To this end, a voltage equal to or lower than the power supply voltage is supplied to the gate line G to cut off all the transfer transistors MN1-0 to MNn-0 and MN1-17 to MNn-17 connected to the select lines SGD1 to SGDn and SGS1 to SGSn, respectively. This voltage equal to or lower than the power supply voltage is also applied to the gate line G during the operation (data load) of fetching an address for performing data erase.

Figure 6:
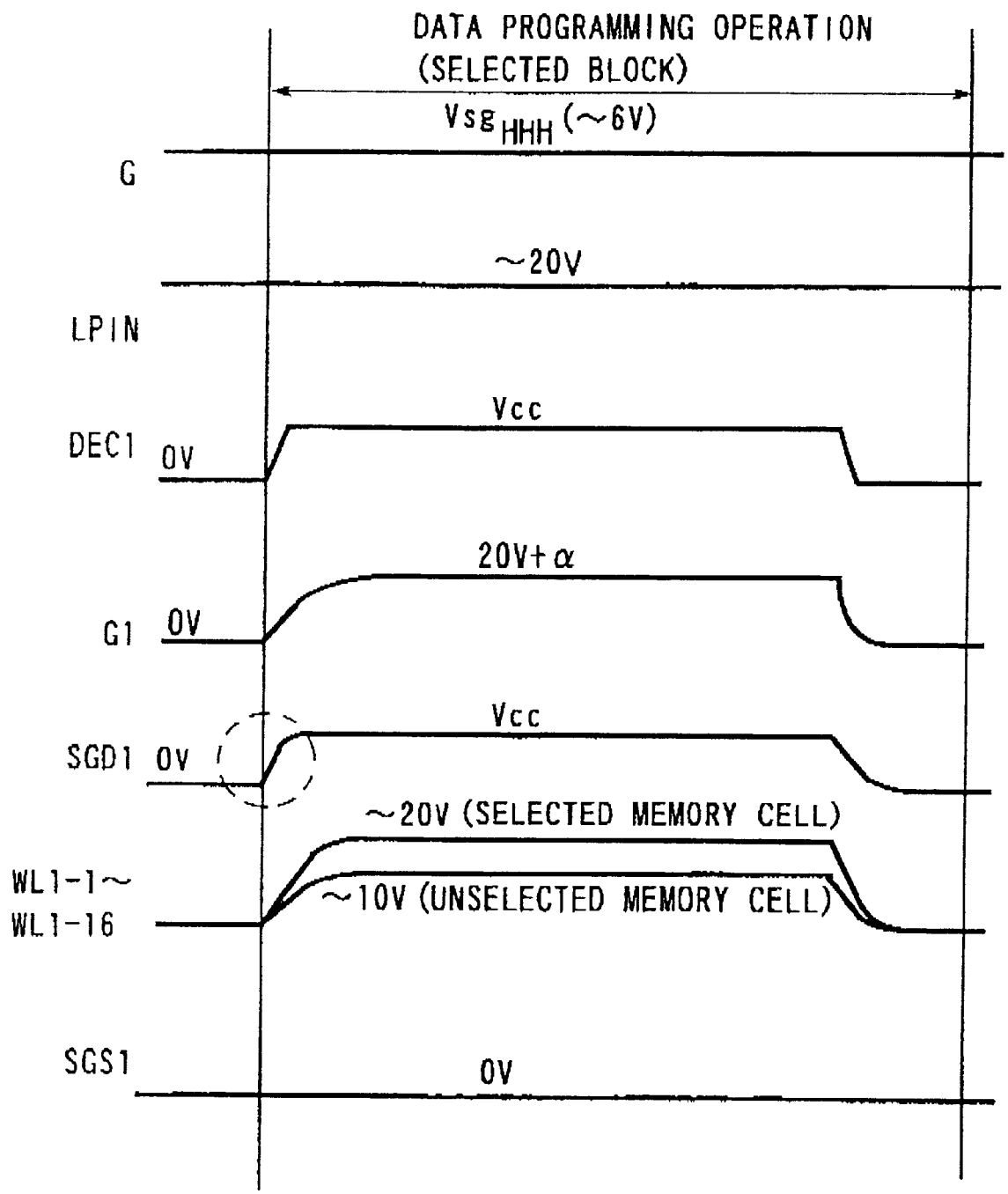
FIG. 6 is a timing chart showing the data programming operation in the semiconductor memory of the first embodiment.

In a data programming operation as shown in FIG. 6, the select line control circuit 13-1 in the selected block C1 supplies the power supply voltage Vcc to the select line SGD1. Also, the select line control circuit 14-1 supplies the ground voltage (0 V) to the select line SGS1.

Figure 7:
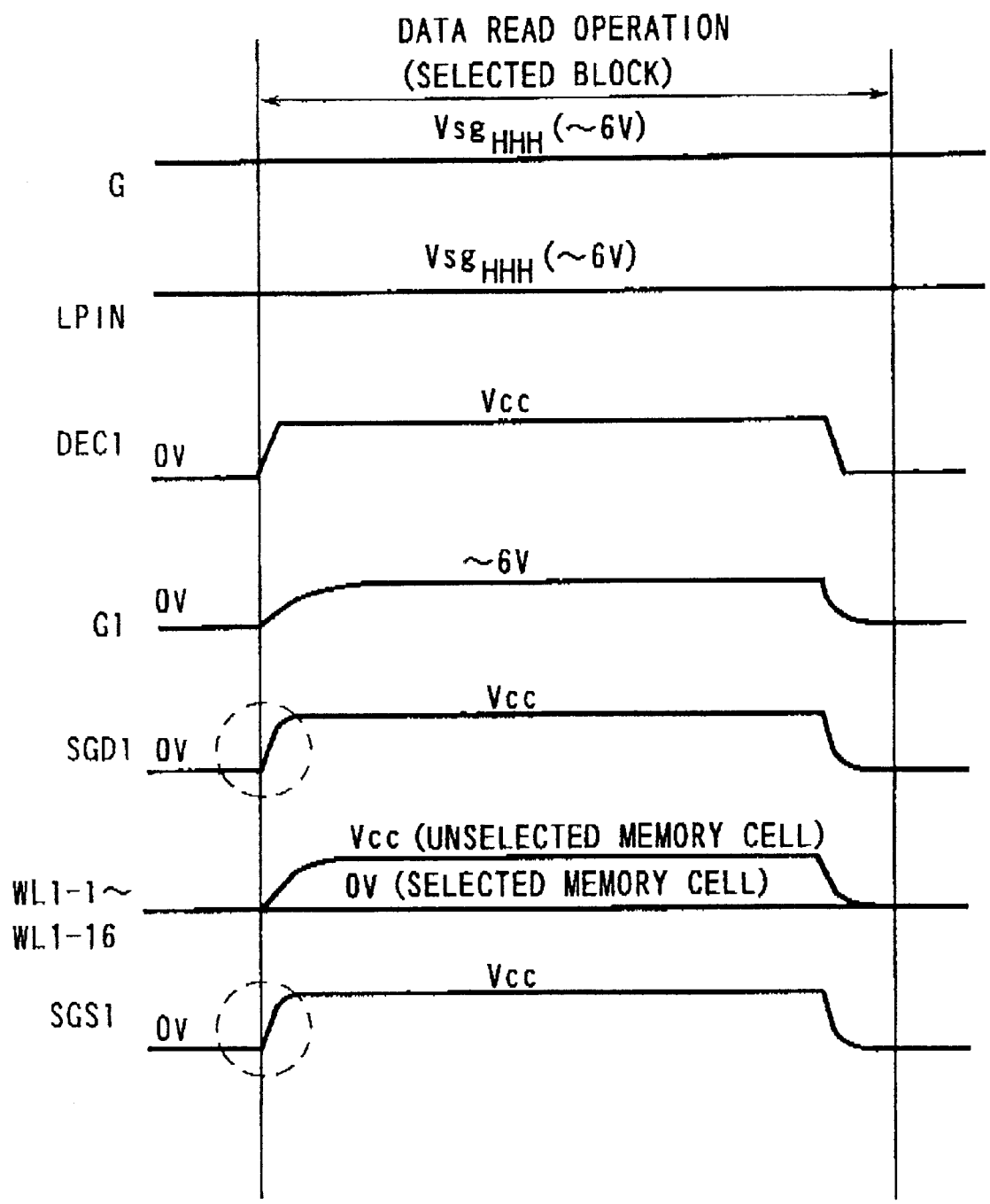
FIG. 7 is a timing chart showing the data read operation in the semiconductor memory of the first embodiment.

In a data read operation as shown in FIG. 7, the select line control circuit 13-1 in the selected block Cl supplies a read voltage (about 3.5 V) to the select line SGD1. The select line control circuit 14-1 also supplies this read voltage (about 3.5 V) to the select line SGS1. In the unselected blocks C2 to Cn, the ground voltage is supplied to the select lines SGD2 to SGDn and SGS2 to SGSn regardless of whether the mode is data programming or data read.

In the data programming and read operations, therefore, to transfer these voltages from all the select line control circuits to all the select lines, the transfer transistors MN1-0 to MNn-0 and MN1-17 to MNn-17 must be turned on.

In this first embodiment, when the data programming and read operations are to be performed, a predetermined boosted voltage higher than the power supply voltage is supplied to the gate line G in the standby state, in both selected blocks and unselected blocks, thereby turning on the transfer transistors MN1-0 to MNn-0 and MN1-17 to MNn-17. Since the transfer transistors MN1-0 to MNn-0 and MN1-17 to MNn-17 are thus turned on, it is possible to greatly reduce the delay when the voltages of the nodes SGDIN1 to SGDINn and SGSIN1 to SGSINn are transferred to the select lines SGD1 to SGDn and SGS1 to SGSn, respectively.

Additionally, the select line control circuits 13-1 and 14-1 are arranged in the block C1, the select line control circuits 13-2 and 14-2 are arranged in the block C2, and the select line control circuits 13-k and 14-k (k=3, 4, ..., n) are arranged in the block Ck (k=3, 4, ..., n). That is, a pair of the select line control circuits 13-n and 14-n are set in each block Cn. This can shorten the wiring length between these select line control circuits and the select lines and thereby reduce the wiring delay. Accordingly, voltages can be rapidly transferred from the select line control circuits 13-1 to 13-n to the select lines SGD1 to SGDn. Analogously, voltages can be rapidly transferred from the select line control circuits 14-1 to 14-n to the select lines SGS1 to SGSn. As a consequence, the date write and read operations can be performed at high speed.

FIGS. 6 and 7 are timing charts showing the data programming and read operations, respectively. As shown, in the data programming operation the select line SGD1 rises without producing any large delay. Also, in the data read operation the select lines SGD1 and SGS1 rise without producing any large delay.

Figure 1:
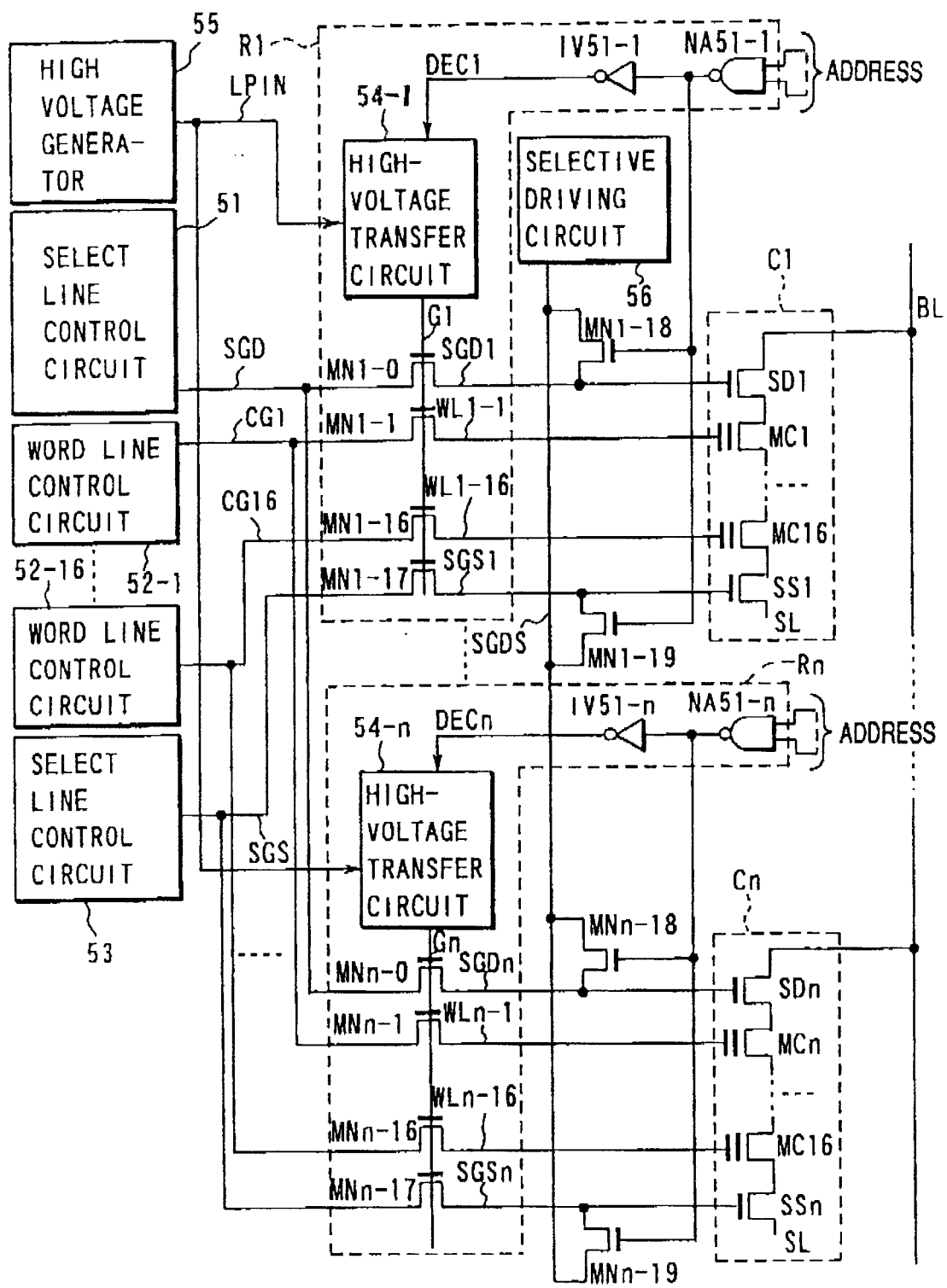
FIG. 1 is a circuit diagram of a circuit for supplying voltages to select lines and word lines of a conventional NAND cell.
Figure 2:
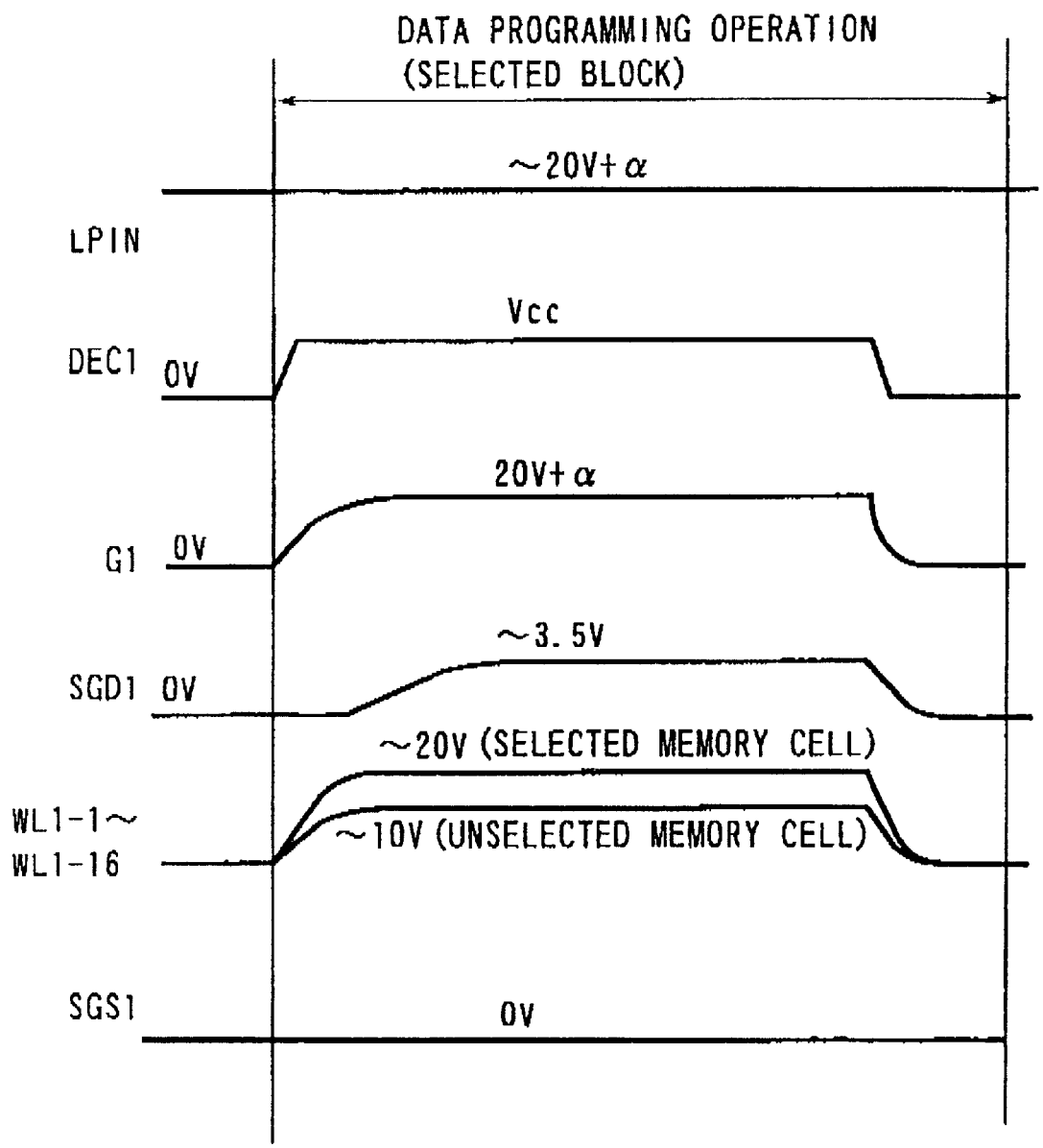
FIG. 2 is a timing chart showing the data programming operation in the circuit shown in FIG. 1.
Figure 3:
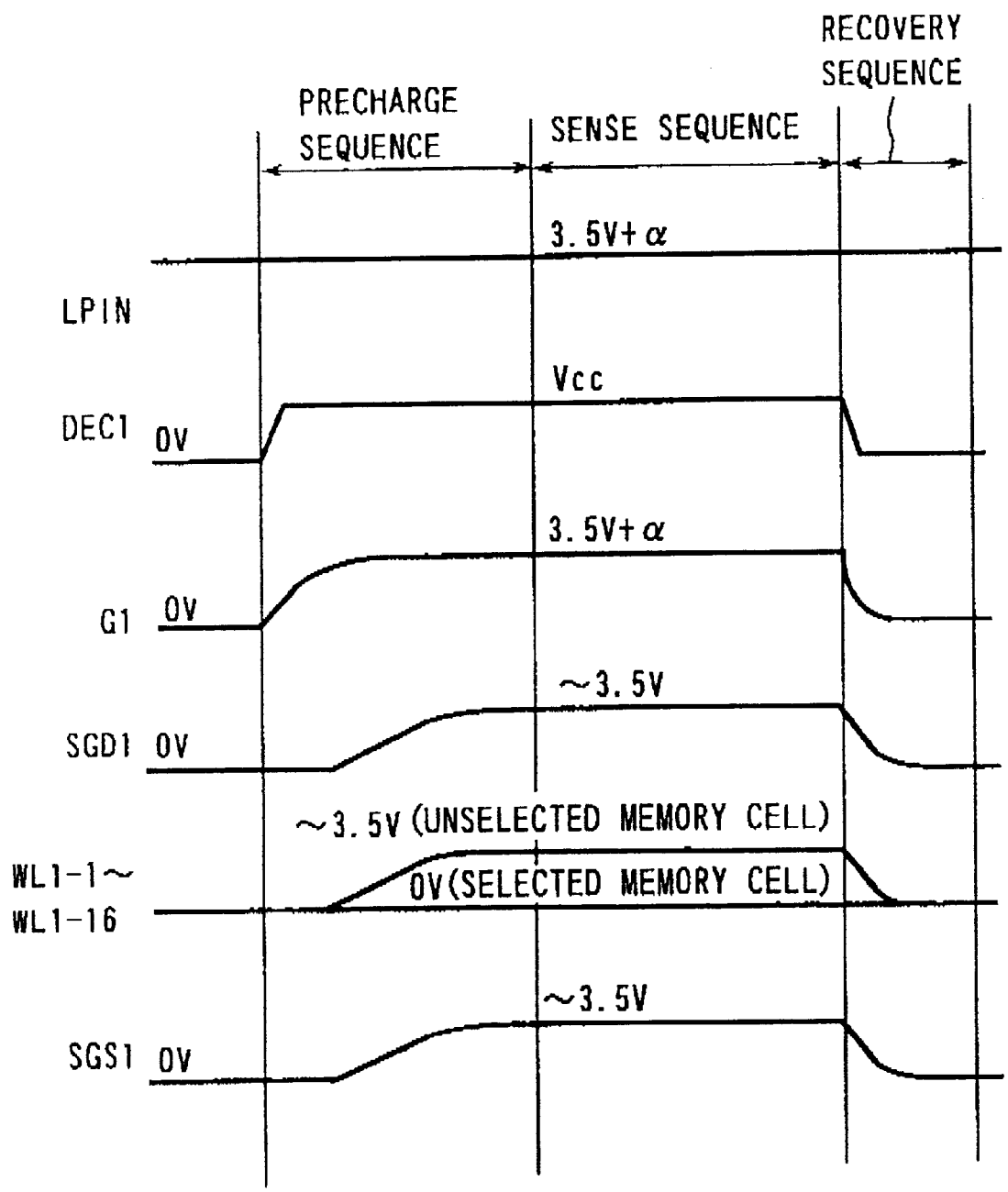
FIG. 3 is a timing chart showing the data read operation in the circuit shown in FIG. 1.
Figure 4:
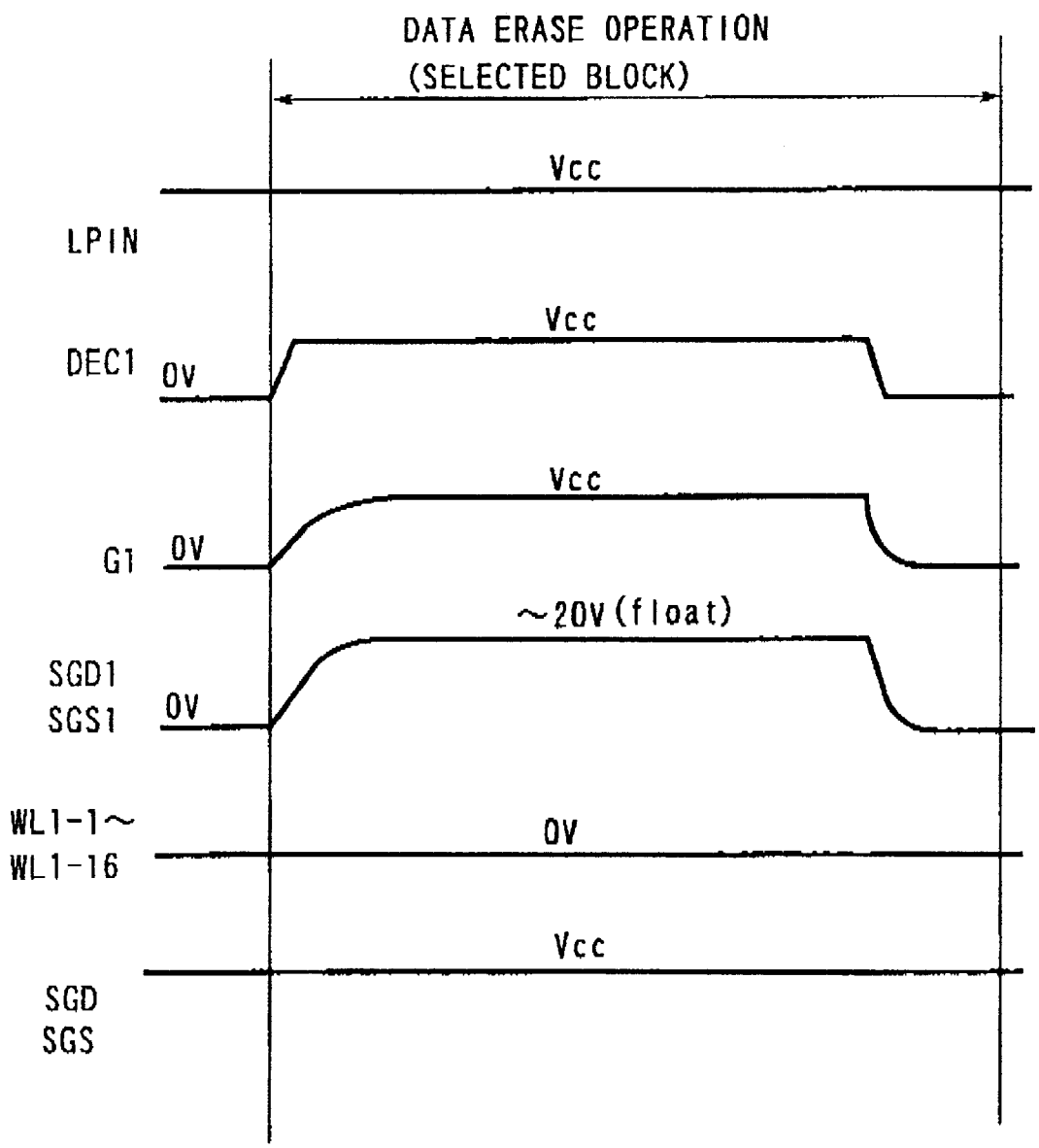
FIG. 4 is a timing chart showing the data erase operation in the circuit shown in FIG. 1.

In the device shown in FIG. 1, the read operation rate is determined by the resistance of the transfer transistors MN1-0 and MN1-17 for transferring voltages to the select lines SGD1 and SGS1, and by the voltage boosting time of the gate electrodes of these transfer transistors. In this first embodiment, the voltage control circuit 11 supplies the predetermined boosted voltage higher than the power supply voltage to the gate line G in the standby state to fix the gate voltage of the transfer transistors MN1-0 to MNn-0 and MN1-17 to MNn-17 at the predetermined boosted voltage higher than the power supply voltage in the standby state, thereby keeping these transfer transistors on. This eliminates the boosting time of the gate electrodes of these transfer transistors MN1-0 to MNn-0 and MN1-17 to MNn-17. Consequently, it is possible to maintain a low on-state resistance and increase the rate of the read operation.

Furthermore, since the gate voltage of the transfer transistors MN1-0 to MNn-0 and MN1-17 to MNn-17 is fixed at the predetermined boosted voltage higher than the power supply voltage, the number of times of charge/discharge of the gate voltage reduces. This can reduce the supply charge amount of the boosted voltage generator 12 for supplying the boosted voltage. Accordingly, it is possible to reduce the load on this boosted voltage generator 12 and suppress current consumption.

Also, the gate electrodes of the transfer transistors MN1-0 to MNn-0 and MN1-17 to MNn-17 are separated from the gate electrodes of the transfer transistors MN1-1 to MN1-16, MN2-1 to MN2-16, . . . , MNn-1 to MNn-16 connected to the word lines. That is, the gate line G and the gate line Gi are formed by different lines. Hence, the gate line G need not transfer any high voltages such as a high voltage Vpp (about 20 V) and a intermediate voltage VppM (about 10 V) which the gate line G1 must transfer.

For example, in the conventional device shown in FIG. 1, when data is to be written, the gate lines G1 to Gn supply a high voltage (about 20 V) even to the gate electrodes of the transfer transistors MN1-0 to MNn-0 and MN1-17 to MNn-17 for transferring voltages to the select lines. In this first embodiment, however, the gate line G connected to the transfer transistors for transferring voltages to the select lines is separated from the gate line G1 connected to the transfer transistors for transferring voltages to the word lines. Hence, the gate line G need not transfer the high voltage (about 20 V). This obviates the need to supply the unnecessary high voltage (about 20 V) to the gate electrodes of the transfer transistors MN1-0 to MNn-0 and MN1-17 to MNn-17. This can also reduce the load on the boosted voltage generator 12 and suppress current consumption.

In the first embodiment as explained above, the gates of the transfer transistors for transferring voltages to the select lines and the gates of the transfer transistors for transferring voltages to the word lines are separated in all the blocks. Therefore, constant voltages can be supplied to the gates of the transfer transistors for transferring voltages to the select lines, and the number of times of charge/discharge of the gates of these transfer transistors can be reduced. Accordingly, it is possible to supply stable voltages to the gates of the transfer transistors connected to the select lines, reduce the load on the booster circuit, reduce current consumption, and rapidly transfer voltages to the select lines. This makes a high-speed operation, particularly a high-speed read operation feasible.

Furthermore, the gate electrodes of the transfer transistors for transferring voltages to the select lines are connected together in all the blocks. In the read standby state and in the data read and write operations, the predetermined boosted voltage higher than the power-supply voltage is supplied to the gate electrodes of these transfer transistors, thereby constantly maintaining the transfer transistors for transferring voltages to the select lines in a low onstate resistance. Consequently, voltages can be rapidly transferred from the select line control circuits to the select lines, and the read operation rate can be increased.

Since the select line control circuits are included in each block, the loads on the individual select line control circuits can be reduced. The wiring delay can also be reduced because the wiring length between the select line control circuits and the select lines can be shortened. Therefore, voltages of the select lines can be rapidly transferred, so the select transistors can be rapidly turned on. This allows a high-speed read operation.

Also, the gate line G connected to the transfer transistors for transferring voltages to the select lines is separated from the gate line G1 connected to the transfer transistors for transferring voltages to the word lines. This makes it possible to reduce the number of times of charge/discharge of the gates of the transfer transistors for transferring voltages to the select lines, reduce the supply load on the boosted voltage generator, and to reduce current consumption. Furthermore, compared to the prior art shown in FIG. 1, the gate voltage of the transfer transistors for transferring voltages to the select lines in the data programming operation can be lowered from about 20 V to about 6 V.

The first embodiment has been explained by taking a NAND EEPROM as an example. However, the first embodiment is also applicable to other nonvolatile memories having select lines, e.g., a common AND flash EEPROM and DINOR flash EEPROM.

Second Embodiment

A semiconductor memory according to the second embodiment of the present invention will be described below.

Figure 8:
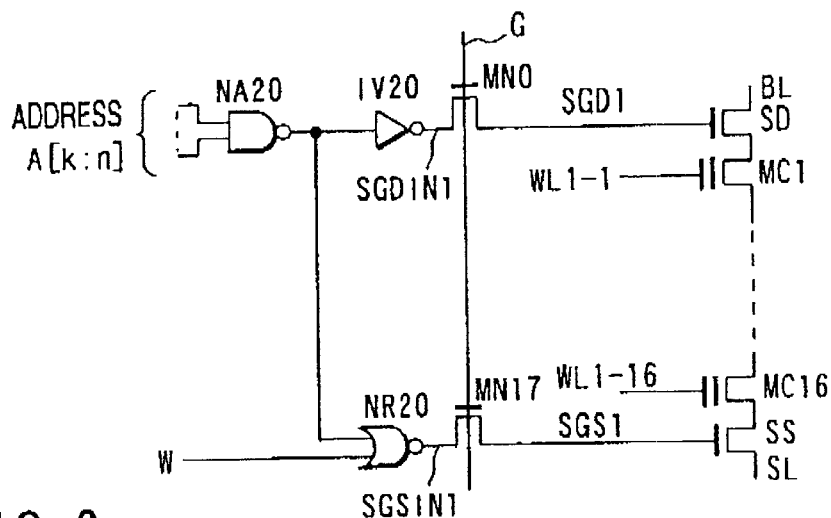
FIG. 8 is a circuit diagram showing the configuration of select line control circuits in a semiconductor memory according to a second embodiment of the present invention.
Figure 9:
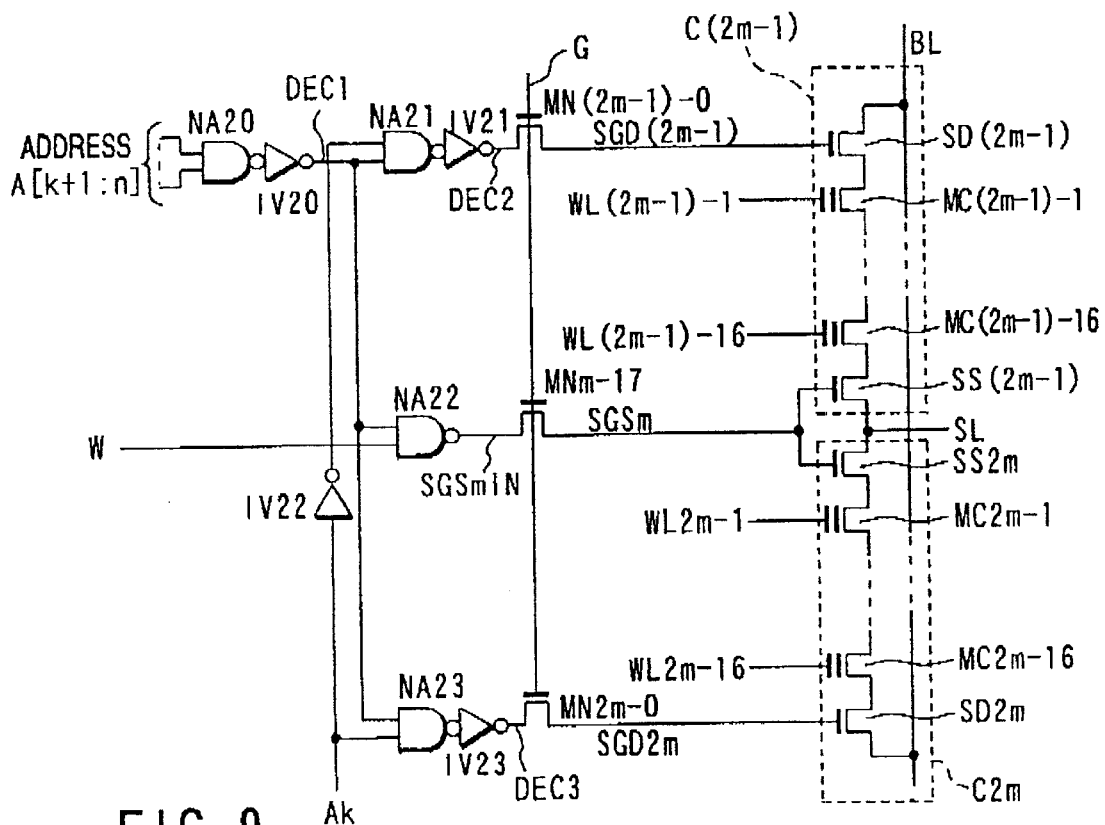
FIG. 9 is a circuit diagram showing the configuration of select line control circuits according to a modification of the semiconductor memory of the second embodiment.
Figure 12:
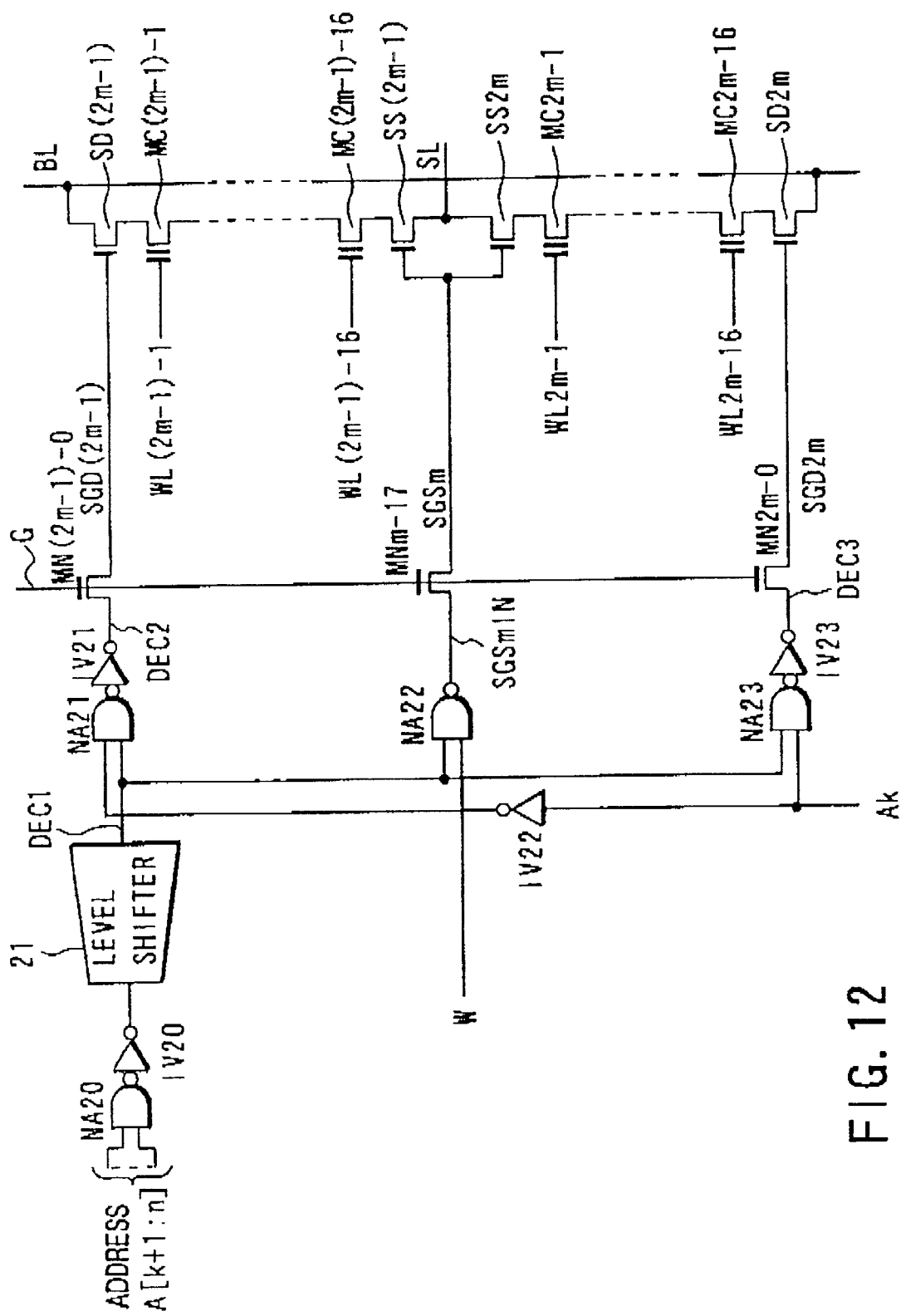
FIG. 12 is a circuit diagram showing the configuration of select line control circuits according to another modification of the semiconductor memory of the second embodiment.

FIGS. 8, 9, and 12 are circuit diagrams illustrating the arrangements of select line control circuits and NAND cells of semiconductor memories of the second embodiment and its modifications.

The select line control circuits have a function of rapidly transferring voltages to select lines. To rapidly transfer voltages to select lines, a circuit is desirably constituted by high-current-driven transistors. In this second embodiment, the select line control circuits are high-current-driven transistors. A high-current-driven transistor has a thin gate insulating film and is used to transfer voltages from the ground voltage to about the power-supply voltage.

FIG. 8 shows select line control circuits of one block. For the sake of simplicity, only one bit line is shown as a memory cell array in FIG. 8. The circuit shown in FIG. 8 is one example for realizing the data programming and read operations, shown respectively in FIGS. 6 and 7.

As shown in FIG. 8, memory cells MC1 to MC16 are connected in series. The drain of the memory cell MC1 is connected to the source of a elect transistor SD. The source of the memory cell MC16 is connected to the drain of a select transistor SS. The drain of the select transistor SD is connected to a bit line BL. The source of the select transistor SS is connected to a source line SL.

Word lines WL1-1 to WL1-16 are connected to the gate electrodes of the memory cell transistors MC1 to MC16, respectively. A select line SGD1 is connected to the gate electrode of the select transistor SD which is connected to the bit line BL. A select line SGS1 is connected to the gate electrode of the select transistor SS which is connected to the source line SL.

The source of a transfer transistor MN0 is connected to the select line SGD1, and the drain of the transistor MN0 is connected to a node SGDIN1. This node SGDIN1 is connected to the output terminal of an inverter IV20. The source of a transfer transistor MN17 is connected to the select line SGS1, and the drain of the transistor MN17 is connected to a node SGSIN1. This node SGSIN1 is connected to the output terminal of a NOR gate circuit NR20. The transfer transistors MN0 and MN17 are high-breakdown-voltage transistors having a thick gate insulating film. The gate electrodes of these transfer transistors MN0 and MN17 are connected together to a gate line G. This gate line G is separated from the gate electrodes (not shown) of transfer transistors for transferring voltages to word lines.

An address signal ADDRESS is input to a NAND gate circuit NA20, and the output from this NAND gate circuit 20 is supplied to the input terminal of the 1inverter IV20 and the first input terminal of the NOR gate circuit NR20. A control signal W is input to the second input terminal of the NOR gate circuit NR20. This control signal w controls voltages to be supplied to the select line SGS1. In FIG. 8, a select line control circuit for driving the select line SGD1 is a simple short connector in which a row address decode signal is directly supplied to the node SGSIN1. The NAND gate circuit NA20 and the NOR gate circuit NR20 described above constitute a row address decoding circuit and a select line control circuit for driving the select line SGS1.

All of the NAND gate circuit NA20, the inverter IV20, and the NOR gate circuit NR20 are high-current-driven transistors having a thin gate insulating film. A row address signal (the address is Ak, A(k+1), . . . , An) is input to the NAND gate circuit NA20. The output from this NAND gate circuit NA20 is input to the inverter IV20 and the NOR gate circuit NR20.

When a high voltage is supplied to the gate line G in the semiconductor memory constructed as above, the transfer transistor MN0 is turned on to supply a row address decode signal to the select line SGD1. This decode signal is at the power supply voltage when indicating that the block is selected and at the ground voltage when indicating that the block is not selected. Similarly, when a high voltage is supplied to the gate line G to turn on the transfer transistor MN17, the row address decode signal described above is output to the select line SGS1. In data programming, however, this select line SGS1 is constantly set at the ground voltage by switching the control signal W from the ground voltage to the power supply voltage.

In this second embodiment shown in FIG. 8, the gates of the transfer transistors for transferring voltages to the select lines are separated from the gates of the transfer transistors for transferring voltages to the word lines as in the first embodiment. In a read or write operation, a constant boosted voltage higher than the power supply voltage is supplied to the gates of the transfer transistors for transferring voltages to the select lines. The transfer transistors are maintained in a low on-state resistance. In addition, the select line control circuits for supplying voltages to the gates of the select transistors are high-current-driven transistors. Therefore, the power supply voltage or the ground voltage can be rapidly transferred to the gates of the select transistors. This is particularly effective to increase the read operation rate.

A modification of the select line control circuits will now be discussed below with reference to FIG. 9.

FIG. 9 is a circuit diagram showing the modification of the select line control circuits and the arrangement of NAND cells. FIG. 9 shows select line control circuits of two blocks and shows only one bit line as a memory cell array. In this modification, adjacent select lines on the source line side in the second embodiment shown in FIG. 8 are connected together.

Memory cells MC(2m−1)-1 to MC(2m−1)-16 are connected in series. The drain of the memory cell MC(2m−1)-1 is connected to a select transistor SD(2m−1). The source of the memory cell MC(2m−1)-16 is connected to a select transistor SS(2m−1). Memory cells MC2m-1 to MC2m-16 are also connected in series. The drain of the memory cell MC2m-16 is connected to a select transistor SD2m. The source of the memory cell MC2m-1 is connected to a select transistor SS2m. The select transistors SD(2m−1) and SD2m are connected together to a bit line BL. The select transistors SS(2m−1) and SS2m are connected together to a source line SL.

Word lines WL(2m−1)-1 to WL(2m−1)-16 are connected to the gate electrodes of the memory cell transistors MC(2m−1)-1 to MC(2m−1)-16, respectively. A select line SGD(2m−1) is connected to the gate electrode of the select transistor SD(2m−1) which is connected to the bit line BL. A select line SGSm is connected to the gate electrode of the select transistor SS(2m−1) which is connected to the source line SL. Word lines WL2m-1 to WL2m-16 are connected to the gate electrodes of the memory cell transistors MC2m-1 to MC2m-16, respectively. A select line SGD2m is connected to the gate electrodes of the select transistor SD2m which is connected to the bit line BL. The select line SGSm is connected to the gate electrode of the select transistor SS2m which is connected to the source line SL.

The source of a transfer transistor MN(2m−1)-0 is connected to the select line SGD(2m−1), and the drain of the transistor MN(2m−1)-0 is connected to a node DEC2. This node DEC2 is connected to the output terminal of an inverter IV21. The source of a transfer transistor MNm-17 is connected to the select line SGSm, and the drain of the transistor MNm-17 is connected to a node SGSmIN. This node SGSmIN is connected to the output terminal of a NAND gate circuit NA22. The source of a transfer transistor MN2m-0 is connected to the select line SGD2m, and the drain of the transistor MN2m-0 is connected to a node DEC3. This node DEC3 is connected to the output terminal of an inverter IV23. The gate electrodes of the transfer transistors MN(2m−1)-0, MNm-17, and MN2m-0 are connected together to a gate line G. These transfer transistors MN(2m−1)-0, MNm-17, and MN2m-0 are high-breakdown-voltage transistors having a thick gate insulating film.

A row address signal ADDRESS (A(k+1), A(k+2), . . . , An) is input to a NAND gate circuit NA20, and the output from this NAND gate circuit NA20 is supplied to the first input terminals of NAND gate circuits NA21, NA22, and NA23 via an inverter IV20. A least significant row address Ak is input to the second input terminal of the NAND gate circuit NA21 via an inverter IV22. This least significant address Ak is directly input to the NAND gate circuit NA23. A control signal W is input to the NAND gate circuit NA22.

The output from the NAND gate circuit NA21 is supplied to the node DEC2 via the inverter IV21. The output from the NAND gate circuit NA22 is supplied to the node SGSmIN. Furthermore, the output from the NAND gate circuit NA23 is supplied to the node DEC3 via the inverter IV23. The NAND gate circuit NA21 and the inverter IV21 constitute a select line control circuit for driving the select line SGD (2m−1). The NAND gate circuit NA22 constitutes a select line control circuit for driving the select line SGSm. The NAND gate circuit NA23 and the inverter IV23 constitute a select line control circuit for driving the select line SGD2m.

In the circuit constructed as above, all of the NAND gate circuits NA20 to NA23 and the inverters IV20 to IV23 are high-current-driven transistors having a thin gate insulting film. A row address signal (A(k+1), . . . , An) except for the least significant address Ak is input to the NAND gate circuit NA20. The inverter IV20 supplies a row address decode signal except for the least significant address to a node DEC1.

The row address decode signal except for the least significant address is input to the first input terminal of the NAND gate circuit NA21 via the node DEC1. The least significant address Ak is input to the second input terminal of this NAND gate circuit NA21 via the inverter IV22. The NAND gate circuit NA21 NANDs the input signals to the first and second input terminals and outputs the result to the inverter IV21. The inverter IV21 supplies the row address decode signal to the node DEC2.

The row address decode signal except for the least significant address is input to the first input terminal of the NAND gate circuit NA22 via the node DEC1. The control signal W is input to the second input terminal of this NAND gate circuit NA22. The NAND gate circuit NA22 NANDs the input signals to the first and second input terminals and outputs the result to the node SGSmIN.

The row address decode signal except for the least significant address is input to the first input terminal of the NAND gate circuit NA23 via the node DEC1. The least significant address Ak is input to the second input terminal of this NAND gate circuit NA23. The NAND gate circuit NA23 NANDs the input signals to the first and second input terminals and outputs the result to the inverter IV23. The inverter IV23 supplies the row address decode signal to the node DEC3. Note that the least significant address Ak is a signal for discriminating between adjacent blocks.

Figure 10:
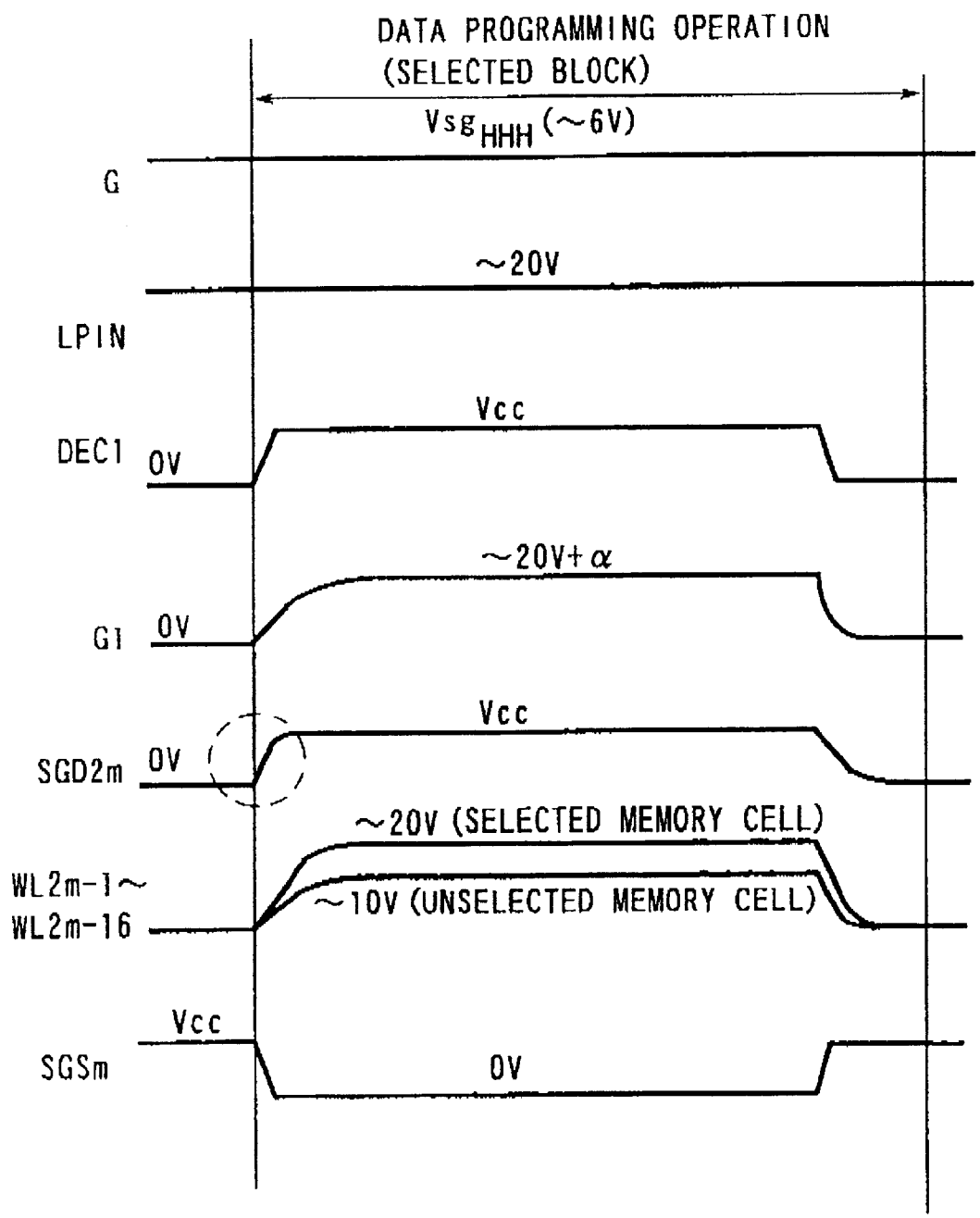
FIG. 10 is a timing chart showing the data programming operation in the circuit shown in FIG. 9.
Figure 11:
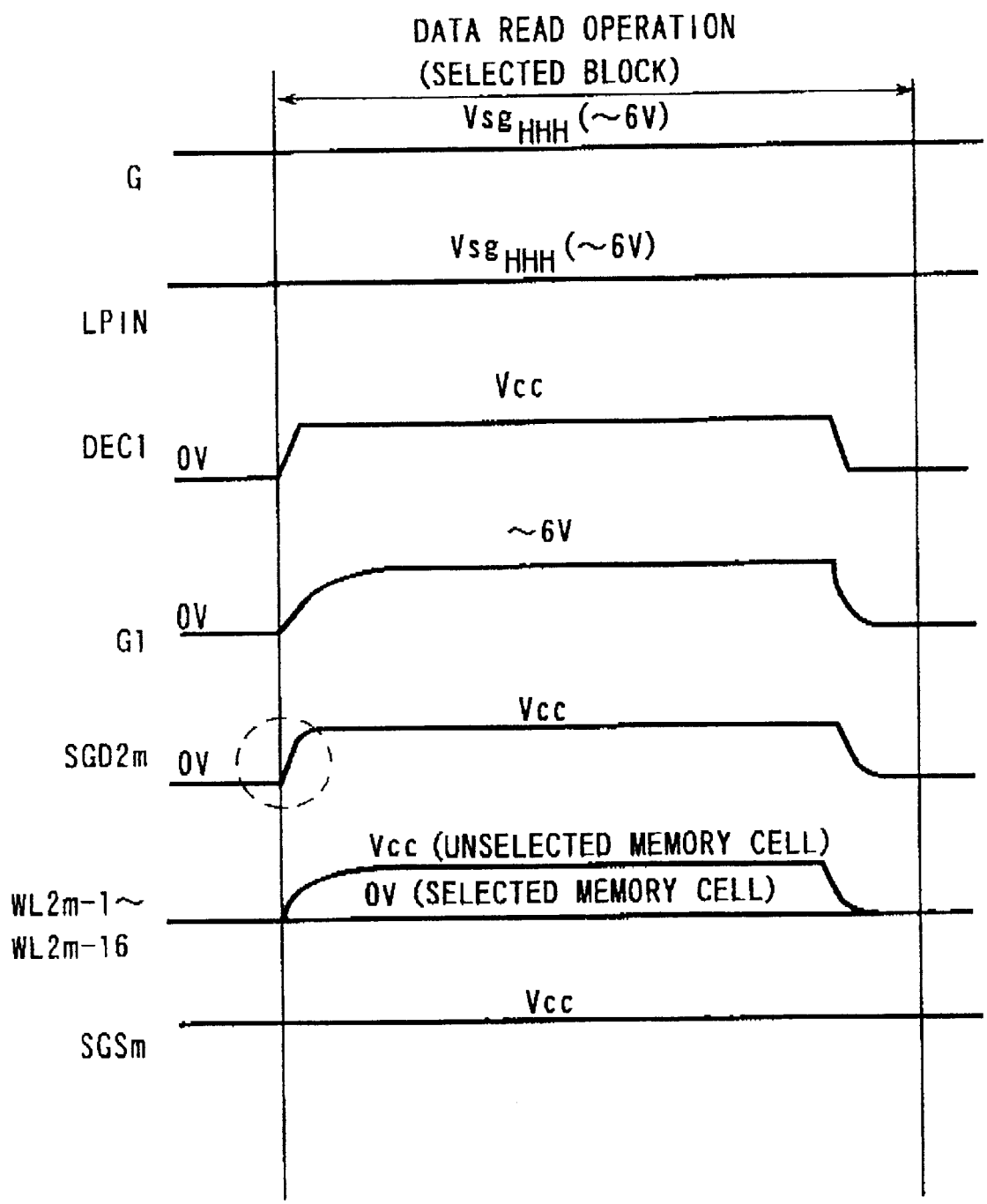
FIG. 11 is a timing charge showing the data read operation in the circuit shown in FIG. 9.

In the modification shown in FIG. 9, adjacent select lines on the source line side are connected together. Therefore, the number of elements forming a row decoder can be reduced compared to the circuit shown in FIG. 8. FIGS. 10 and 11 are timing charts showing write and read operations, respectively, performed by the select line control circuits shown in FIG. 9. As shown in FIG. 10, when the block Cod is selected in data programming, the control signal W is set at the power-supply voltage to supply the ground voltage from the NAND gate circuit NA22 to the node SGSmIN. In other cases, the control signal W is set at the ground voltage in the standby state to constantly supply the power-supply voltage from the NAND gate circuit NA22 to the node SGSmIN. In either case, a constant voltage (about 6 V) higher than the power supply voltage is always supplied to the gate line G to keep the transfer transistor MNm-17 on, thereby transferring the voltage of the node SGSmIN to the select line SGSm. In a block selected in write and read operations, a high constant voltage (about 6 V) is always supplied to the gate line G. Since this can reduce the number of times of charge/discharge of the gate of the transfer transistor MNm-17, current Ad consumption can be reduced. Also, as shown in FIG. 11, in a block selected in data read, the voltage of the select line SGSm remains unchanged. So, the read operation rate can be further increased.

That is, in this modification of the second embodiment shown in FIG. 9, adjacent select lines are connected together. This makes it possible to reduce the number of circuit elements and reduce the chip area. Furthermore, only in a block selected in data programming, a predetermined voltage (e.g., 0 V) lower than the power supply voltage is supplied to the select line SGSm connected to the gate electrodes of the select transistors SS(2m−1) and SS2m on the source line side. In other cases, a predetermined boosted voltage equal to or higher than the power supply voltage is supplied to this select line SGSm. Since this reduces voltage changing portions in data read, it is possible to increase the read operation rate and reduce current consumption.

A further modification of the select line control circuits will be described with reference to FIG. 12. FIG. 12 is a circuit diagram showing another modification of the select line control circuits and the arrangement of NAND cells.

FIG. 12 shows select line control circuits of two blocks and shows only one bit line as a memory cell array. This modification shown in FIG. 12 is obtained by adding a level shifter 21 between the inverter IV20 and the NAND gate circuit NA21 in the modification shown in FIG. 9. After row addresses except the least significant address are decoded, this level shifter 21 shifts the level of the power supply from the power supply voltage to a boosted voltage higher than the power supply voltage. The rest of the configuration is the same as in FIG. 9.

Figure 13:
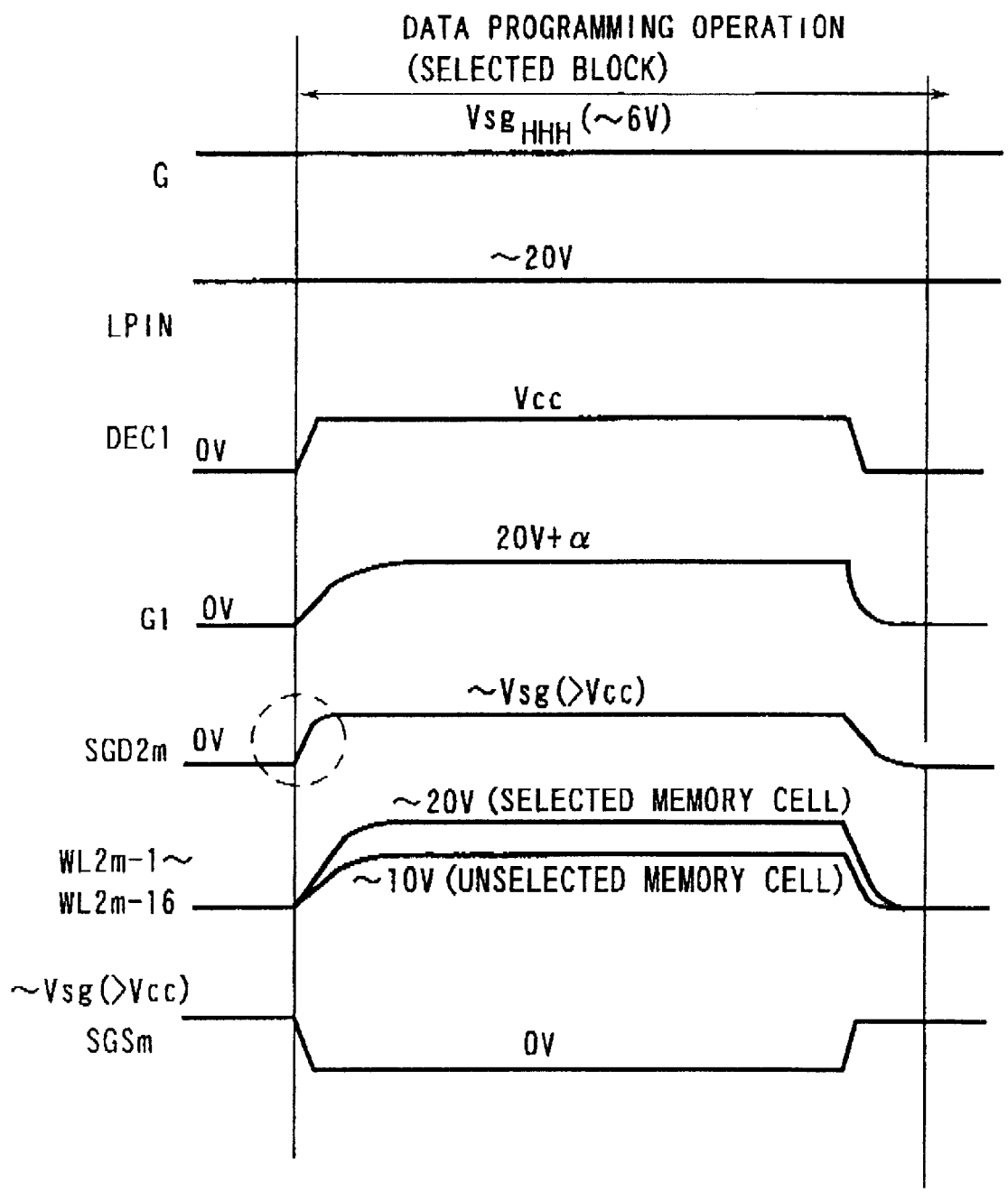
FIG. 13 is a timing chart showing the data programming operation in the circuit shown in FIG. 12.
Figure 14:
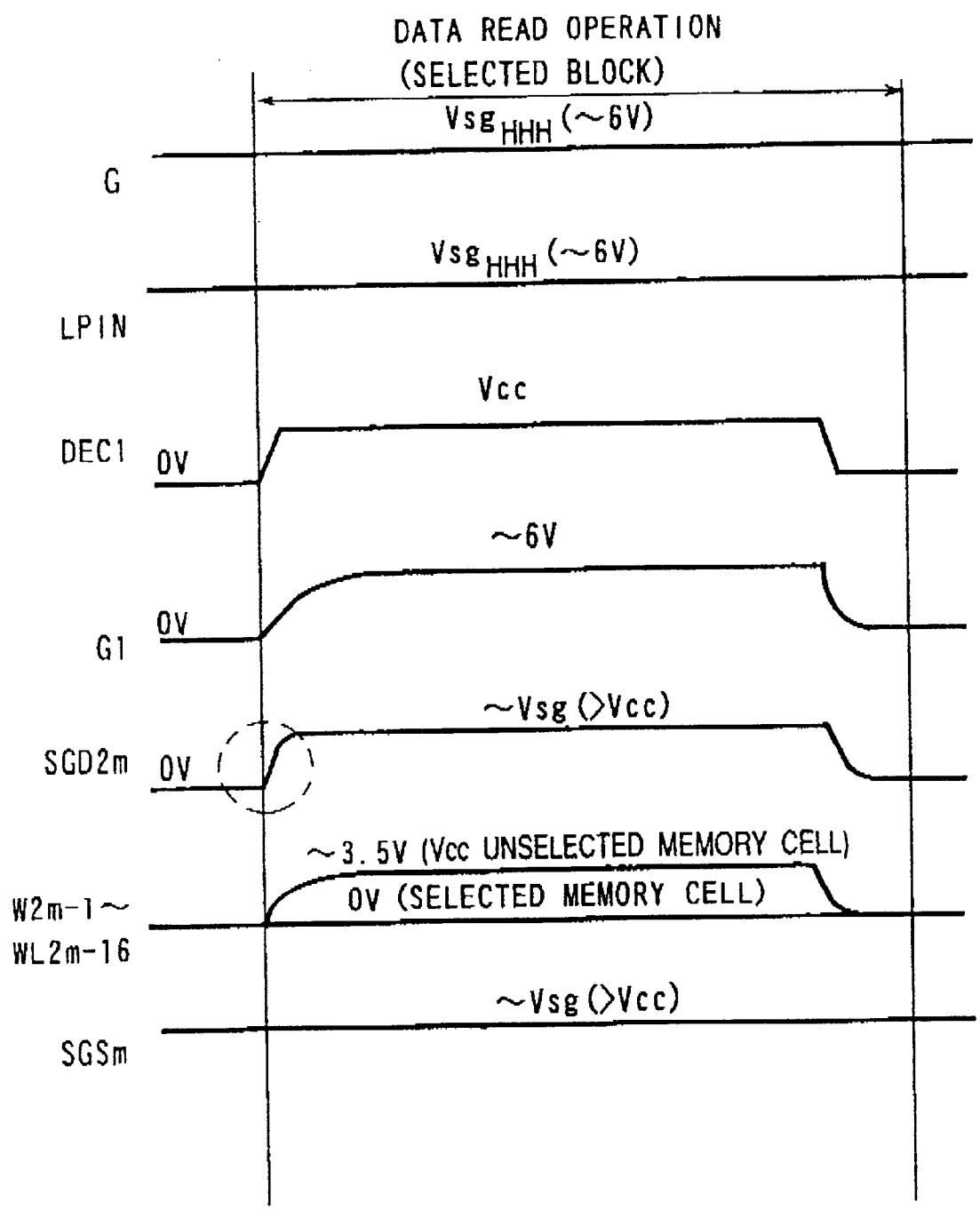
FIG. 14 is a timing charge showing the data read operation in the circuit shown in FIG. 12.

FIGS. 13 and 14 are timing charts showing write and read operations, respectively, performed by the select line control circuits shown in FIG. 12. Even when a semiconductor device has a low operating power-supply voltage, the select line control circuits shown in FIG. 12 can perform voltage transform by using the level shifter 21, thereby transferring a high voltage to the gates of select transistors SD(2m−1), SS(2m−1), SS2m, and SD2m. Since this further reduces the resistance of these select transistors, it is possible to increase the rates of circuit operations, particularly the rate of a read operation.

In the second embodiment already described, the transistors constituting the select line control circuits are high-current-driven transistors having a thin gate insulating film. These transistors can rapidly transfer voltages to the select lines and further increase the read operation rate. Furthermore, since the level shifting circuit is included in the block selecting circuit composed of a row decoder, a low operating power supply voltage can be used. That is, since a boosted voltage higher than the power supply voltage can be supplied to the select lines, the resistance of the select transistors can be lowered. Accordingly, it is possible to increase the current flowing in memory cells and further increase the read operation rate.

The second embodiment and its modifications shown in FIGS. 8, 9, and 12 have been explained by taking NAND cell type EEPROMS as examples. However, the second embodiment and its modifications are also applicable to other nonvolatile memories having select lines, e.g., a common AND flash EEPROM and DINOR flash EEPROM.

Third Embodiment

A semiconductor memory according to the third embodiment of the present invention will be described below.

Figure 15:
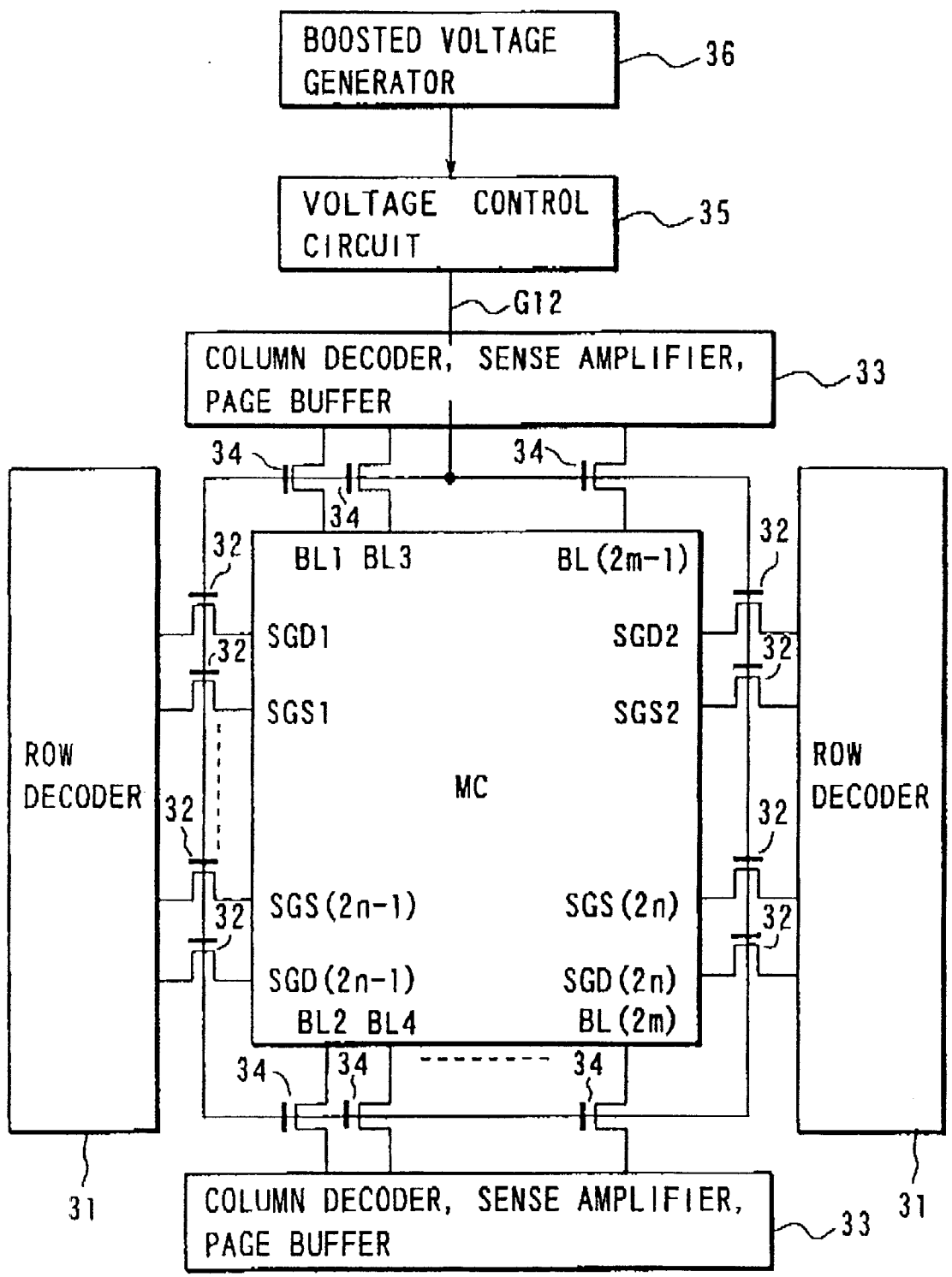
FIG. 15 is a schematic view showing the basic arrangement of a semiconductor memory according to a third embodiment of the present invention.

FIG. 15 is a view showing the basic configuration of the semiconductor memory of the third embodiment. This semiconductor memory has a function of rapidly transferring voltages to select lines and bit lines.

As shown, select lines SGD1, SGD2, . . . , SGD(2n) are connected to select transistors formed on the bit line side of a memory cell array MC. Select lines SGS1, SGS2, . . . , SGS(2n) are connected to select transistors formed on the source line side of this memory cell array MC. Transfer transistors 32 are inserted between the select lines SGD1 to SDG(2n) and row decoders 31 and between the select lines SGS1 to SGS(2n) and the row decoders 31 to transfer voltages to these select lines.

Also, transfer transistors 34 are inserted between all column-side bit lines BL1 to BL(2m) and column decoders (including sense amplifiers and page buffers) 33 to transfer voltages to these bit lines.

The gate electrodes of these transfer transistors 32 and 34 are connected together to a gate line G12. This gate line G12 is connected to a boosted voltage generator 36 for outputting a boosted voltage equal to or higher than the power supply voltage via a voltage control circuit 35.

When data erase or data load is to be performed in the semiconductor memory constructed as above, the voltage control circuit 35 outputs a voltage equal to or lower than the power supply voltage to the gate line G12. In other cases, the voltage control circuit 35 outputs a boosted voltage VSGHHH equal to or higher than the power supply voltage, which is supplied from the boosted voltage generator 36, to the gate line 12 in the standby state.

In the semiconductor memory shown in FIG. 15, the gate electrodes of the transfer transistors 32 connected to the select lines of all blocks and the gate electrodes of the transfer transistors 34 connected to the bit lines of all columns are connected together to the gate line G12. Accordingly, the same method can be used to supply voltages to the gate electrodes of the transfer transistors in the row and column directions. This makes it possible not only to simplify the circuit operation but also to decrease the circuit area of the voltage control circuit for supplying voltages to the gate electrodes of these transfer transistors. Furthermore, the chip area of the semiconductor memory can be reduced.

The third embodiment has been explained by taking a NAND EEPROM as an example. However, the third embodiment is also applicable to other nonvolatile memories having select lines, e.g., a common AND flash EEPROM and DINOR flash EEPROM.

Fourth Embodiment

A device in which a plurality of memory cell transistors connected in series are formed by a single memory cell transistor principally in a NAND flash EEPROM will be described below. This device will be referred to as a 3-transistor NAND flash memory hereinafter. In this 3-transistor NAND flash memory, the number of transistors connected in series is small. Therefore, a memory cell read current is large, and this makes a high-speed read operation feasible. In this fourth embodiment, a plurality of memory cell transistors in the NAND cell of the first embodiment shown in FIG. 5 are replaced with a single memory cell.

Figure 16:
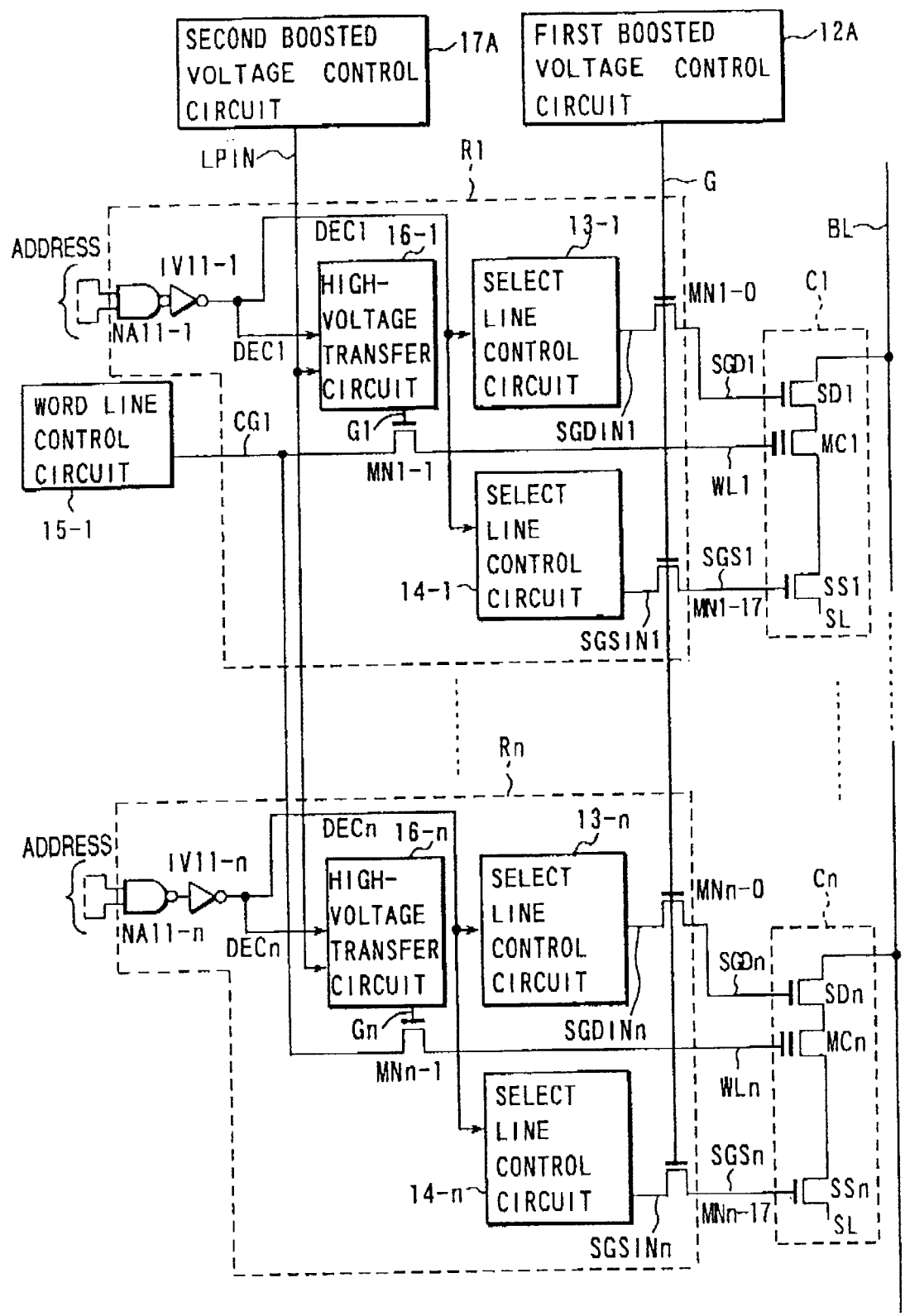
FIG. 16 is a block diagram showing the arrangement of a semiconductor memory according to a fourth embodiment of the present invention.

FIG. 16 is a block diagram showing the arrangement of a semiconductor memory according to the fourth embodiment of the present invention. FIG. 16 shows row decoders of n blocks and their control circuits in a 3-transistor NAND flash memory. The circuit configuration will be described below by using a NAND cell, row decoder, and its control circuit in the first block.

Transistors MN1-0, MN1-1, and MN1-17 are high-breakdown-voltage transistors having a thick gate insulating film which permits a high voltage to be applied to their nodes. Portions R1 to Rn surrounded by the broken lines indicate row decoders of blocks C1 to Cn. Each of these blocks C1 to Cn indicates a memory cell and select transistors in the block. For the sake of descriptive simplicity, FIG. 16 shows only one bit line.

The drain of a memory cell MC1 is connected to a select transistor SD1, and the source of this memory cell MC1 is connected to a select transistor SS1. The select transistor SDi is connected to a bit line BL. The select transistor SS1 is connected to a source line SL.

A word line WL1 is connected to the gate electrode of the memory cell transistor MC1. A select line SGD1 is connected to the gate electrode of the select transistor SD1 which is connected to the bit line BL. A select line SGS1 is connected to the gate electrode of the select transistor SS1 which is connected to the source line SL.

The source of the transfer transistor MN1-0 is connected to the select line SGD1. The source of the transfer transistor MN1-17 is connected to the select line SGS1. The gate electrodes of these transfer transistors MN1-0 and MN1-17 are connected together to a gate line G, and this gate line G is connected to all blocks. That is, this gate line G is connected to the gate electrodes of transfer transistors MNk-0 and MNk-17 (k=1, 2, . . . , n) of all the blocks C1 to Cn.

The gate line G is further connected to a first boosted voltage control circuit 12A for supplying a predetermined voltage to this gate line G. In data erase or data load, the first boosted voltage control circuit 12A outputs a voltage equal to or lower than the power supply voltage to the gate line G. In other cases, the first boosted voltage control circuit 12A outputs a boosted voltage higher than the power supply voltage to the gate line G.

The source of the transfer transistor MN1-0 is connected to the select line SGD1, and the drain of the transistor MN1-0 is connected to a node SGDIN1. This node SGDIN1 is connected to a select line control circuit 13-1 for supplying voltages to the select line SGD1. Also, the source of the transfer transistor MN1-17 is connected to the select line SGS1, and the drain of the transistor MN1-17 is connected to a node SGSIN1. This node SGSIN1 is connected to a select line control circuit 14-1 for supplying voltages to the select line SGS1.

The source of the transfer transistor MN1-1 is connected to the word line WL1, and the drain of the transistor MN1-1 is connected, via a control gate line CG1, to a word line control circuit 15 for supplying voltages to the word line WL1. A gate line G1 connected to the gate electrode of the transfer transistor MN1-1 is connected to a high-voltage transfer circuit 16-1. This high-voltage transfer circuit 16-1 is supplied with a high voltage from a second boosted voltage control circuit 17A via a high-voltage transfer line LPIN. In a selected block, the high-voltage transfer circuit 16-1 supplies to the gate line G1 a voltage sufficient for the transfer transistor MN1-1 to transfer the voltage supplied from the word line control circuit 15 to the word line WL1. In an unselected block, this high-voltage transfer circuit 16-1 supplies the ground voltage to the gate line G1.

An address signal ADDRESS is input to a NAND gate circuit NA11-1, and the output from this NAND gate circuit NA11-1 is supplied as a decode signal DEC1 to the select line control circuit 13-1, the select line control circuit 14-1, and the high-voltage transfer circuit 16-1 via an inverter IV11-1.

The word line control circuit 15 is connected to the transfer transistors MN1-1 to MNn-1 in the row decoders R1 to Rn. The second boosted voltage control circuit 17A is connected to the high-voltage transfer circuits 16-1 to 16-n in the row decoders R1 to Rn.

The operation of this semiconductor memory will be described below. A description of the same portions as in the operation of the first embodiment will be omitted, and only different portions will be explained.

The gate electrodes of the transfer transistors MN1-0 to MNn-0 and MN1-17 to MNn-17 connected to the select lines SGD1 to SGDn and SGS1 to SGSn are separated from the gate electrodes of the transfer transistors MN1-1 to MNn-1 connected to the word line WL1. Therefore, to the gate line G connected to the transfer transistors MN1-0 to MNn-0 and MN1-17 to MNn-17, it is unnecessary to transfer high voltages a. such as a high voltage Vpp (about 20 V) and an intermediate voltage Vppm (about 10 V) which must be transferred to the gate lines G1 to Gn. This can reduce the load on the first boosted voltage control circuit 12A and suppress current consumption.

In the fourth embodiment as described above, the gates of the transfer transistors connected to the select lines and the gates of the transfer transistors connected to the word lines are separated in all blocks. Therefore, constant voltages can be supplied to the gates of the transfer transistors for transferring voltages to the select lines, and the number of times of charge/discharge of the gates of these transfer transistors can be reduced. Accordingly, it is possible to supply stable voltages to the gates of the transfer transistors connected to the select lines, reduce the load on the booster circuit, reduce current consumption, and rapidly transfer voltages to the select lines. This makes a high-speed operation, particularly a high-speed read operation feasible.

Fifth Embodiment

Figure 17:
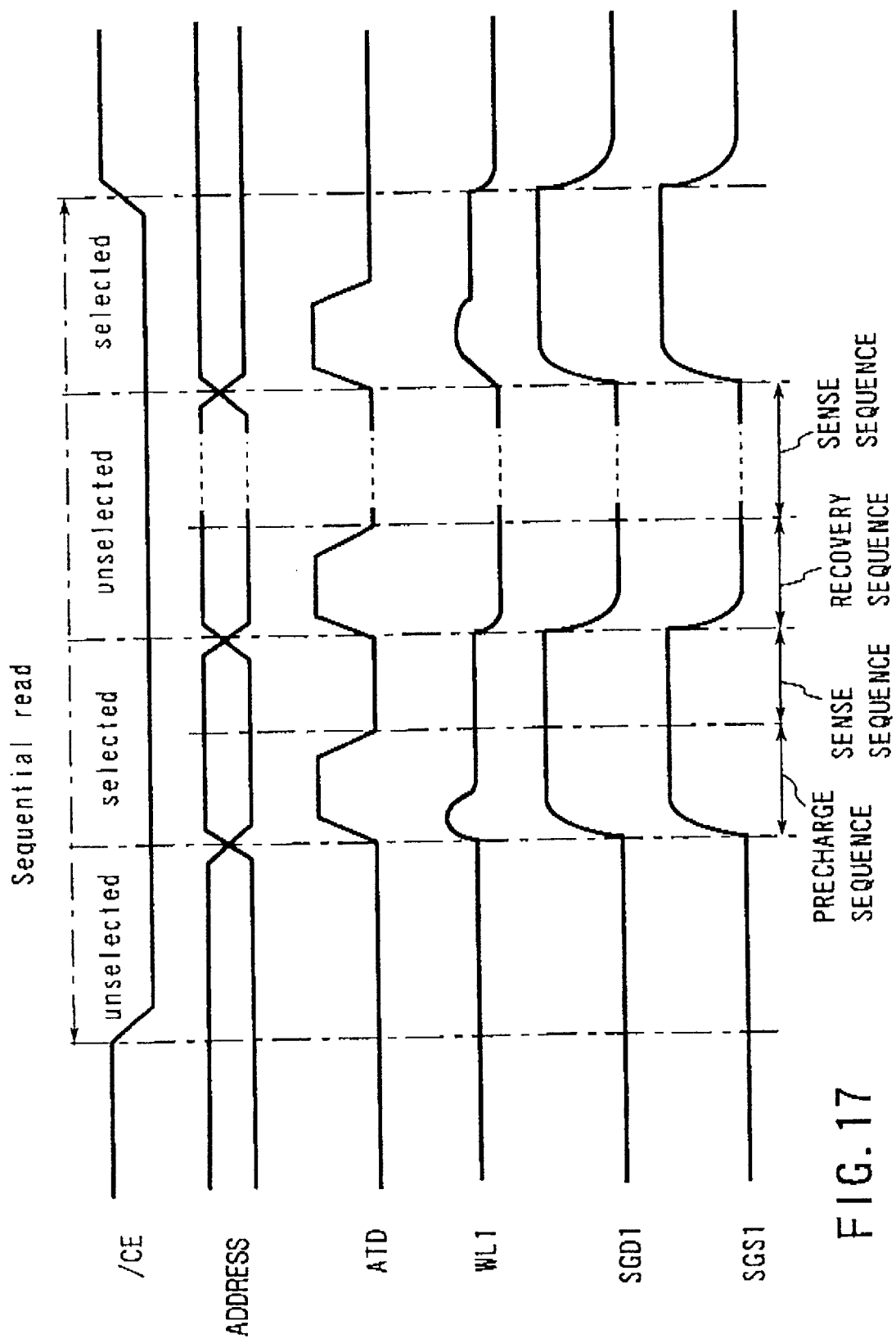
FIG. 17 is a timing chart showing a read operation by which a precharge sequence and recovery sequence are simultaneously performed for a 3-transistor NAND flash memory.

To further increase the read operation rate, a method which simultaneously performs a precharge sequence and recovery sequence as shown in FIG. 17 is applied to the 3-transistor NAND flash memory shown in FIG. 16.

Figure 18:
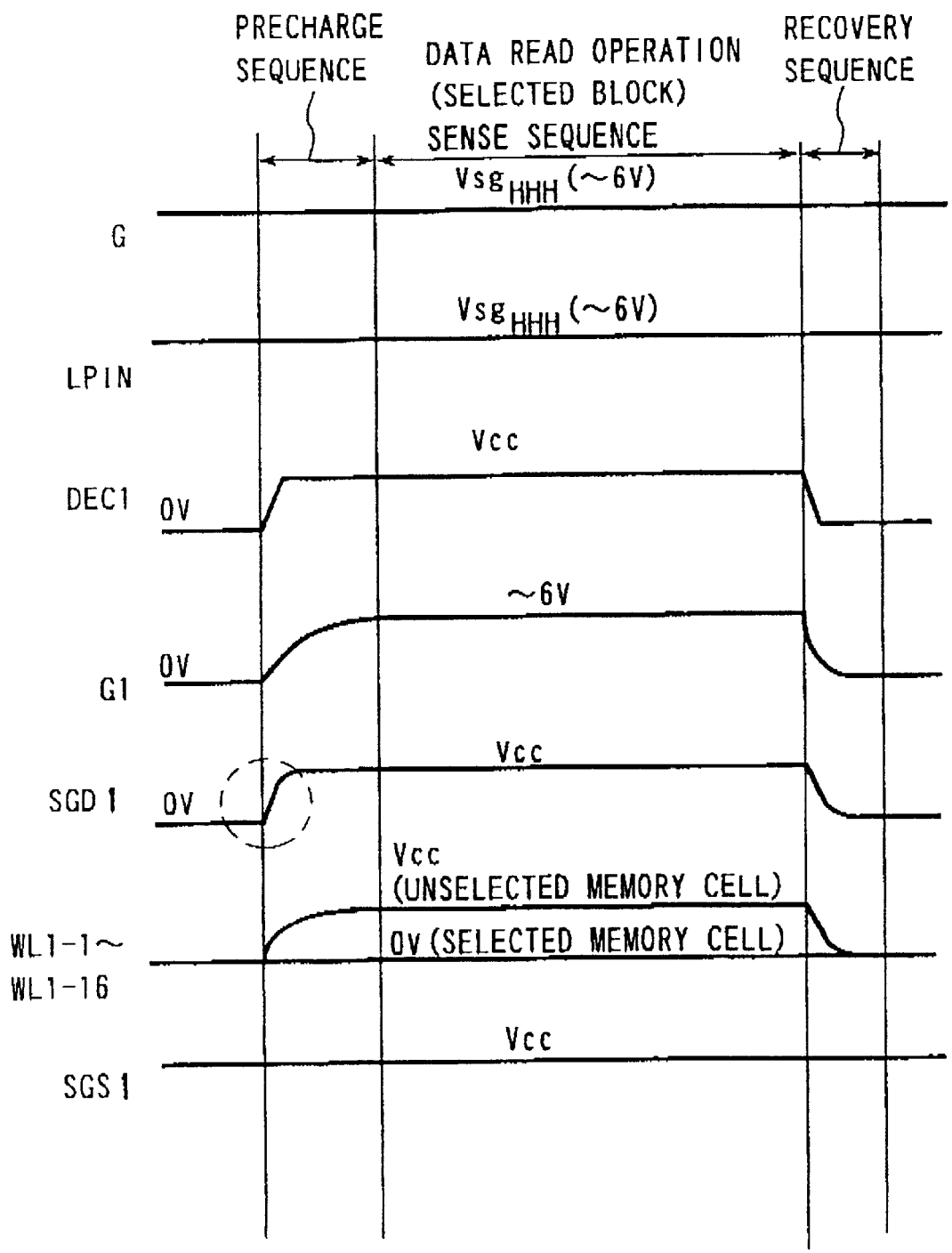
FIG. 18 is a timing chart showing a read operation by which a precharge sequence, sense sequence, and recovery sequence are performed as a series of operations for a NAND flash memory.

As shown in FIG. 18, a read method conventionally used for a NAND flash memory in which a plurality of memory cells are connected in series has three separate periods: a period during which the nodes (select lines, word lines, and bit lines) of a block to be read are charged; a period during which a read operation is actually performed; and a period during which the nodes described above are discharged and returned to the voltages before the read operation. In the following description, the charging period, read period, and discharging period will be referred to as a precharge sequence, sense sequence, and recovery sequence, respectively. This conventionally used read method performs these sequences as a series of operations for a NAND flash memory.

In contrast, the read method shown in FIG. 17 performs the precharge sequence in a selected block and the recovery sequence in an unselected block at the same time in order to read data at high speed. To simultaneously perform the precharge sequence and recovery sequence, in this read method a read operation is started when a chip selecting signal/CE changes from "H" to "L" or when addresses are switched while the chip selecting signal/CE is "L", and is terminated when the chip selecting signal/CE changes from "L" to "H". An address switching signal ATD changes from "L" to "H" when addresses are switched and changes from "H" to "L" when a predetermined time has elapsed. In a period during which this address switching signal ATD is "H", the precharge sequence and recovery sequence are simultaneously executed.

When this read method shown in FIG. 17 is applied to the 3-transistor NAND flash memory shown in FIG. 16, the following inconvenience occurs.

If a read operation is started when the chip selecting signal/CE changes from "H" to "L", no problem arises because the precharge sequence has already been performed for the nodes of a block to be read.

If, however, a read operation is started when addresses are switched while the chip selecting signal/CE is "L", the recovery sequence must be performed for the nodes of a block switched from a selected to an unselected state at the same time a precharge sequence is performed for the nodes of a selected block. Unfortunately, in the 3-transistor NAND flash memory shown in FIG. 16, the word line WL1 of an unselected block is floating, so no recovery sequence can be performed for this word line WL1. Note that the word line WL1 is floating because, in an unselected block, the decode signal DEC1 is set at the ground voltage, and this ground voltage is supplied from the high-voltage transfer circuit 16-1 to the gate line Gl to turn off the transfer transistor MN1-1.

When the word line WL1 of the unselected block is floating, the voltage of the select lines SGD1 and SGS1 on the drain side and source side changes (from the power supply voltage to the ground voltage) in a recovery sequence during the read operation. Under this influence, the voltage of the word line WL1 drops to a negative voltage by the capacitive coupling of the earth capacity of this word line WL1 with the capacitances between the word line and adjacent lines. In this state, a p-n junction formed by the diffusion layer (WL1) as the source of the transfer transistor MN1-1 and the substrate is forward biased and consumes a current. This problem becomes serious as the rate of a read operation is increased or the integration and scale down of LSIs advance. As the integration and scale down of LSIs progress, the line-to-line distance decreases and the inter-line capacitance increases, whereas the earth capacity of a word line does not largely change. This is so because the film thickness of a tunnel oxide film of a memory cell transistor does not largely change, resulting in no large change in the gate capacitance of a memory cell transistor. This increases the voltage variation by the capacitive coupling of the earth capacity of a word line with the capacitances between this word line and adjacent lines. Furthermore, when the voltage of the word line WL1 largely drops to a negative voltage, latch up may occur to destroy the chip.

When a block changes from an unselected to a selected block in a data read operation in the semiconductor memory shown in FIG. 16, the voltage of the word line WL1 rises by the capacitive coupling of the earth capacity of the word line WL1 with the capacitances between this word line WL1 and adjacent lines. As described above, the voltage of the word line WL1 varies in the period of an unselected state, the standby time varies before the voltage stabilizes, and this varies the access time required for reading data. That is, the initial voltage of the word line WL1 at the beginning of data read varies under the influence of voltage variations of adjacent lines in a period during which the block is unselected, resulting in variations in the access time required for reading data. This complicates the design of a read operation.

Especially in a 3-transistor NAND flash memory, the word line WL1 is sandwiched between the select line SGD1 on the drain side and the select line SGS1 on the source side. Therefore, the voltage of the word line WL1 readily varies under the influence of voltage variations of the two select lines.

Also, a 3-transistor NAND flash memory has no unselected memory cells compared to a NAND flash memory having a plurality of memory cells. In a data read operation, therefore, the transfer transistors MN1-1 to MNn-1 need not transfer the read voltage (about 3.5 V) that has been transferred to unselected memory cells. That is, it is only necessary to transfer the ground voltage to the word lines, so a boosted voltage of 6 V need not be supplied to the gate line G1.

In this fifth embodiment, therefore, the ground voltage is supplied to all word lines in the standby state and data read, thereby preventing the word line voltage from varying under the influence of voltage variations of the two select lines. The "standby state" means a state in which operation is waited after the power supply is turned on. The fifth embodiment will be described below. In this fifth embodiment, a description of the same parts as in the fourth embodiment will be omitted by denoting them with the same reference numerals, and only different components will be described below.

Figure 19:
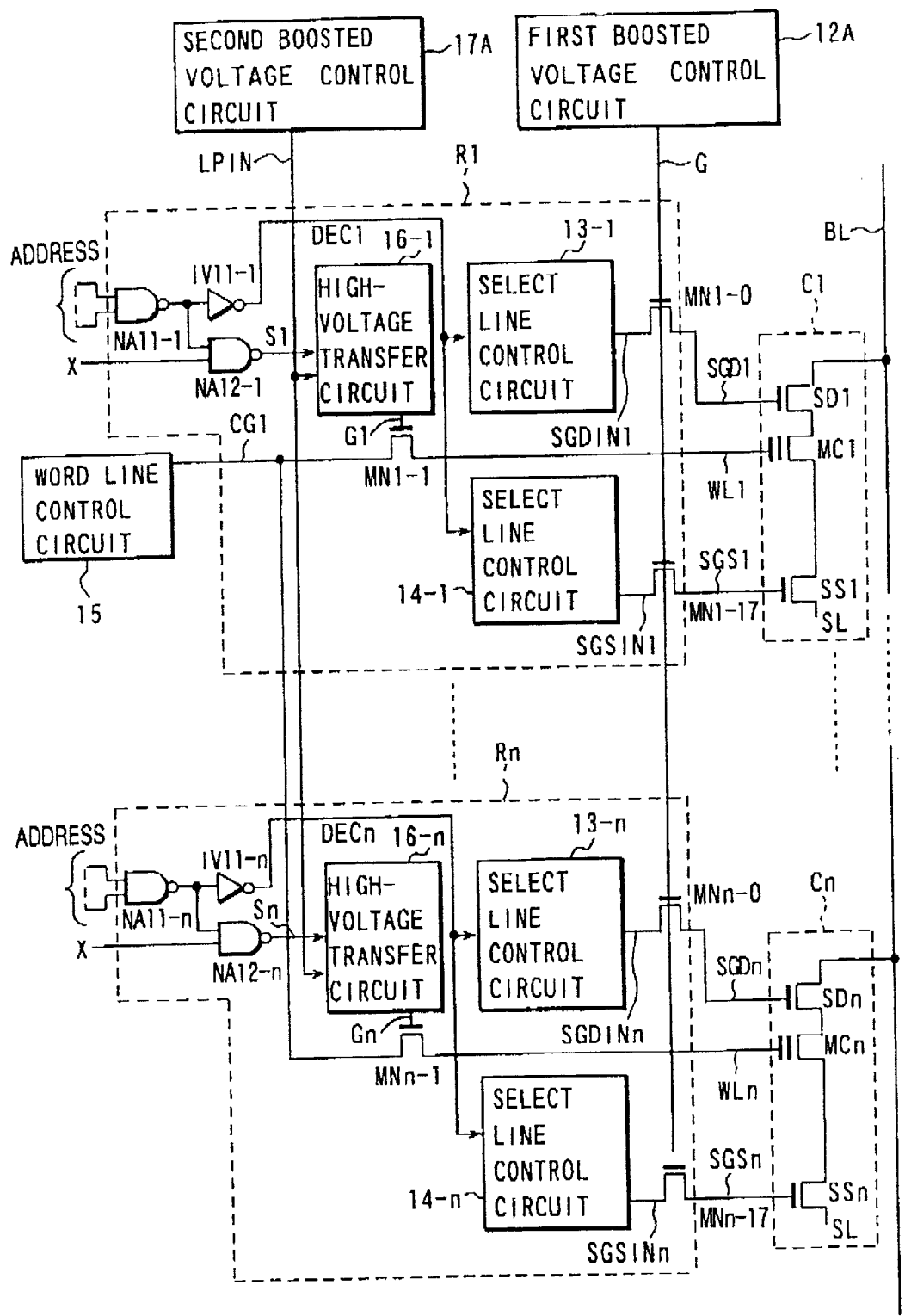
FIG. 19 is a block diagram showing the arrangement of a semiconductor memory according to a fifth embodiment of the present invention.

FIG. 19 is a block diagram showing the arrangement of a semiconductor memory according to the fifth embodiment of the present invention.

As shown, the output from a NAND gate circuit NA11-1 is input to an inverter IV11-1 and to the first terminal of a NAND gate circuit NA12-1. The second terminal of this NAND gate circuit NA12-1 receives a control signal X for controlling the output from this NAND gate circuit NA12-1. The NAND gate circuit NA12-1 NANDs the input signals to the first and second terminals and outputs the result as a decode signal S1.

FIG. 20 shows input and output signals (a decode signal S1 and a gate line G1 in the case of a row decoder R1) of a high-voltage transfer circuit 16-1 in a block C1 in different operating states. In the standby state and data read, the ground voltage is supplied to the second terminal of the NAND gate circuit NA12-1 by the control signal X. This keeps the decode signal S1 at the power supply voltage in the standby state and data read. Note that in the standby state and data read, decode signals S1 to Sn are kept at the power supply voltage in all blocks C1 to Cn.

The high-voltage transfer circuit 16-1 is so designed as to directly output the voltage of the decode signal S1 to the gate line G1 except when data is to be written and the block C1 is selected. Hence, when operation other than data programming is to be performed and the decode signal S1 has the power supply voltage, the high-voltage transfer circuit 16-1 supplies the power supply voltage to the gate line G1. Consequently, the transfer transistor MN1-1 is turned on to supply the voltage of a word line control circuit 15, e.g., the ground voltage in the case of data read, to word lines WL1 to WLn in all the blocks C1 to Cn.

On the other hand, in the standby state and in operation other than data read, the power supply voltage is supplied to the second terminal of the NAND gate circuit NA12-1 by the control signal X. Accordingly, the decode signal S1 becomes a signal determined by an address signal. When data is to be written and the decode signal S1 indicates selection (the power supply voltage), the high-voltage transfer circuit 16-1 supplies a voltage equal to or higher than a "voltage higher by a threshold voltage than a high voltage Vpp (about 20 V)" to the gate line G1. Consequently, the transfer transistor MN1-1 is turned on to supply the high-voltage Vpp from the word line control circuit 15 to the word line WL1.

Figure 21:
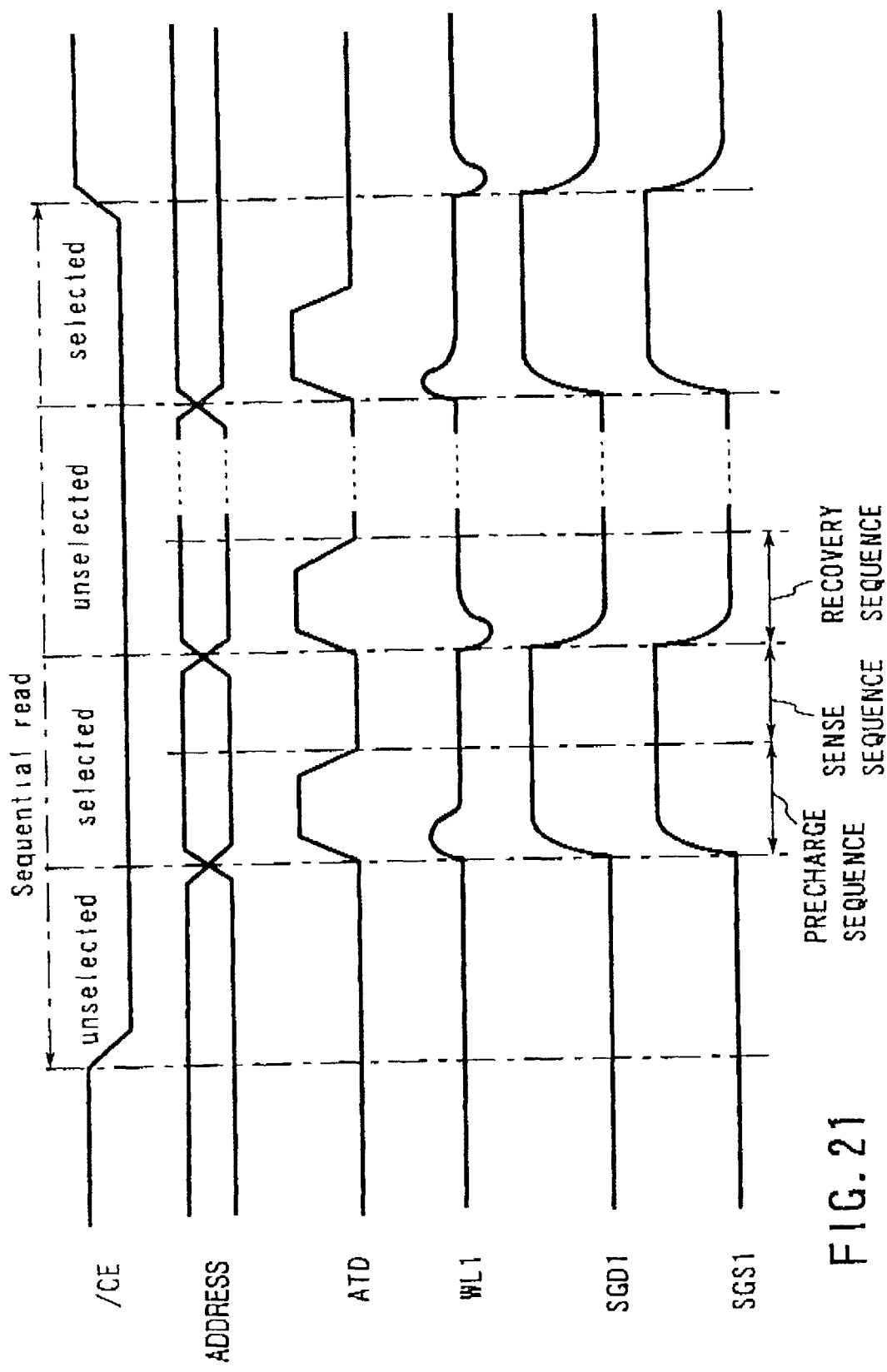
FIG. 21 is a timing chart showing the data read operation in the semiconductor memory of the fifth embodiment.

FIG. 21 is a timing chart showing the read operation in the fifth embodiment. As is apparent from the comparison of FIG. 21 with FIG. 17, in the read operation of this fifth embodiment the word line of an unselected block is not floating but supplied with the ground voltage. Therefore, even when the selected state switches to the unselected state, a voltage variation of the word line is small, and the varied voltage soon recovers to the ground voltage. This stabilizes the voltage of the gate electrode of a memory cell and suppresses variations in the access time required for reading data.

In this fifth embodiment as described above, in the standby state and data read, the ground voltage is supplied to all word lines to prevent voltage variations of these word lines caused by the influence of voltage variations of the two select lines on the drain side and source side of a memory cell. This stabilizes the voltage of the gate electrode of the memory cell and suppresses variations in the access time required for reading data.

The fifth embodiment has been explained by taking a 3-transistor NAND flash memory as an example. However, this fifth embodiment is not limited to a 3-transistor NAND flash memory and a NAND EEPROM having a plurality of memory cells but is also applicable to other nonvolatile memories having select lines, e.g., a common AND flash EEPROM and DINOR flash EEPROM.

Sixth Embodiment

The sixth embodiment as a modification of the above fifth embodiment will be described below.

Figure 22:
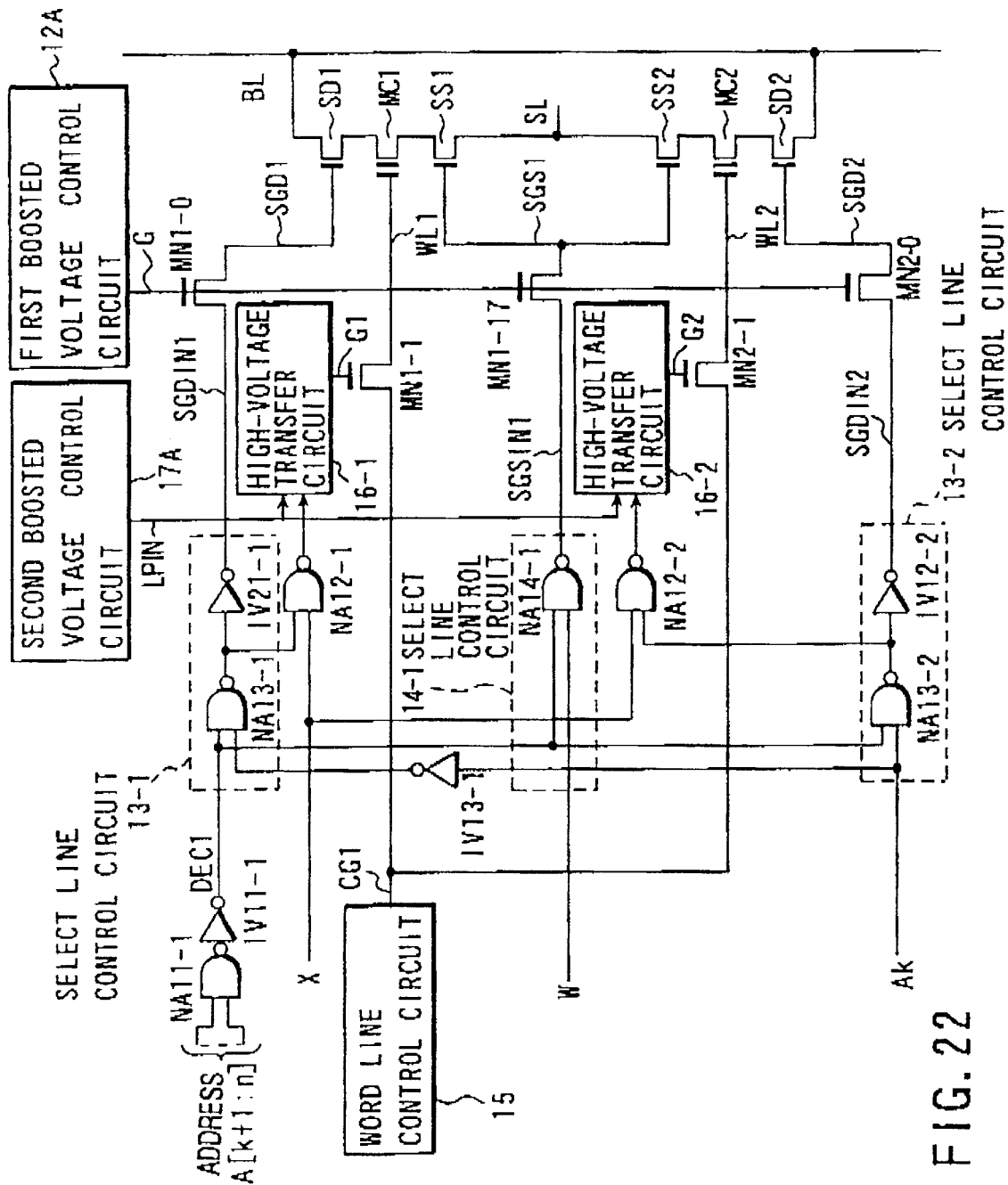
FIG. 22 is a circuit diagram showing the arrangement of a semiconductor memory according to a sixth embodiment of the present invention.

FIG. 22 is a circuit diagram showing the arrangement of a semiconductor memory according to the sixth embodiment. FIG. 22 shows control circuits of two blocks and shows only one bit line as a memory cell array. In this sixth embodiment, adjacent select lines on the source line side in the fifth embodiment shown in FIG. 19 are connected together.

The drain of a memory cell MC1 is connected to a select transistor SD1, and the source of this memory cell MC1 is connected to a select transistor SS1. The drain of a memory cell MC2 is connected to a select transistor SD2, and the source of this memory cell MC2 is connected to a select transistor SS2. The select transistors SD1 and SD2 are connected together to a bit line BL. The select transistors SS1 and SS2 are connected together to a source line SL.

A word line WL1 is connected to the gate electrode of the memory cell transistor MC1. A select line SGD1 is connected to the gate electrode of the select transistor SD1 which is connected to the bit line BL. A word line WL2 is connected to the gate electrode of the memory cell transistor MC2. A select line SGD2 is connected to the gate electrode of the select transistor SD2 which is connected to the bit line BL. Also, a select line SGS1 is connected to the gate electrodes of both the select transistors SS1 and SS2 which are connected to the source line SL.

The source of a transfer transistor MN1-0 is connected to the select line SGD1, and the drain of the transistor MN1-0 is connected to a node SGDIN1. This node SGDIN1 is connected to the output terminal of an inverter IV12-1. The source of a transfer transistor MN1-17 is connected to the select line SGS1, and the drain of the transistor MN1-17 is connected to a node SGSIN1. This node SGSIN1 is connected to the output terminal of a NAND gate circuit NA14-1. The source of a transfer transistor MN2-0 is connected to the select line SGD2, and the drain of the transistor MN2-0 is connected to a node SGDIN2. This node SGDIN2 is connected to the output terminal of an inverter IV12-2. The gate electrodes of the transfer transistors MN1-0, MN1-17, and MN2-0 are connected together to a gate line G. This gate line G is connected to a first boosted voltage control circuit 12A for supplying a predetermined voltage to the gate line G.

The source of a transfer transistor MN1-1 is connected to the word line WL1, and the drain of the transistor MN1-1 is connected, via a control gate line CG1, to a word line control circuit 15 for supplying voltages to the word line WL1. The gate electrode of this transfer transistor MN1-1 is connected to a gain line G1 which is connected to a high-voltage transfer circuit 16-1. This high-voltage transfer circuit 16-1 is supplied with a high voltage by a second boosted voltage control circuit 17A via a high-voltage transfer line LPIN.

The source of a transfer transistor MN2-1 is connected to the word line WL2, and the drain of the transistor MN2-1 is connected, via the control gate line CG1, to the word line control circuit 15 for supplying voltages to the word line WL2. The gate electrode of this transfer transistor MN2-1 is connected to a gain line G2 which is connected to a high-voltage transfer circuit 16-2. This high-voltage transfer circuit 16-2 is supplied with a high voltage by the second boosted voltage control circuit 17A via the high-voltage transfer line LPIN.

An address signal ADDRESS (A(k+1), A(k+2), ..., An) is input to a NAND gate circuit NA11-1, and its output is supplied to the first input terminals of NAND gate circuits NA13-1 and NA13-2 and the NAND gate circuit NA14-1 via an inverter IV11-1. A least significant 9 address Ak is input to the second input terminal of the NAND gate circuit NA13-1 via an inverter IV13-1. This least significant address Ak is directly input to the second input terminal of the NAND gate circuit NA13-2.

The output from the NAND gate circuit NA13-1 is input to the inverter IV12-1 and the first input terminal of a NAND gate circuit NA12-1. The second input terminal of this NAND gate circuit NA12-1 receives a control signal X for controlling the output from the NAND gate circuit NA12-1. The NAND gate circuit NA12-1 NANDs the input signals to the first and second terminals and outputs the operation result to the high-voltage transfer circuit 16-1.

The output from the NAND gate circuit NA13-2 is input to the inverter IV12-2 and the first input terminal of a NAND gate circuit NA12-2. The second input terminal of this NAND gate circuit NA12-2 receives the control signal X for controlling the output from the NAND gate circuit NA12-2. The NAND gate circuit NA12-2 NANDs the input signals to the first and second terminals and outputs the operation result to the high-voltage transfer circuit 16-2.

The second input terminal of the NAND gate circuit NA14-1 receives a control signal W for controlling the output from this NAND gate circuit NA14-1. The NAND gate circuit NA14-1 NANDs the input signals to the first and second terminals and outputs the operation result to the node SGSIN1.

The NAND gate circuit NA13-1 and the inverter IV12-1 constitute a select line control circuit 13-1 for driving the select line SGD1. The NAND gate circuit NA13-2 and the inverter IV12-2 constitute a select line control circuit 13-2 for driving the select line SGD2. The NAND gate circuit NA14-1 constitutes a select line control circuit 14-1 for driving the select line SGS1.

In the fifth embodiment described previously, when a block switches from an unselected to a selected block during a read operation, the select line on the source line side is boosted from the ground voltage to the power supply voltage. In this sixth embodiment, however, the power supply voltage is supplied to the select line SGS1 on the source line side in the standby state. In a data programming operation, the voltage of the select line SGS1 on the source line side is switched from the power supply voltage to the ground voltage only in a selected block.

Figure 23:
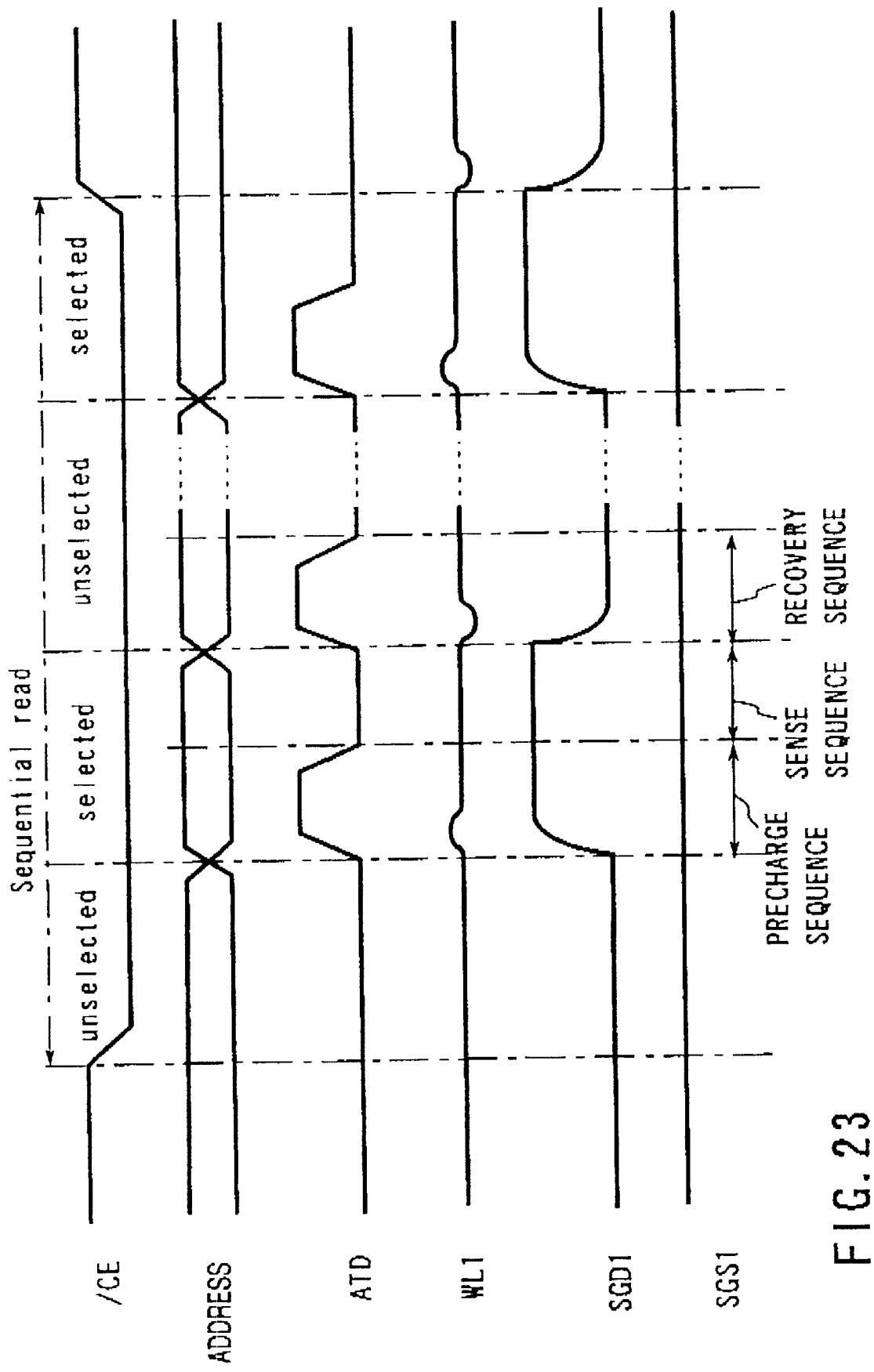
FIG. 23 is a timing chart showing the data read operation in the semiconductor memory of the sixth embodiment.

FIG. 23 is a timing chart showing the read operation in this semiconductor memory. As can be seen by comparing FIG. 23 with FIG. 21, in a selected block during this read operation, the voltage of the select line SGS1 on the source side remains unchanged, so a voltage variation of the word line WL1 decreases. This suppresses a voltage variation of the gate electrode of the memory cell and improves the access time required for reading data. Also, in the sixth embodiment shown in FIG. 22, the number of elements of the address decoding circuit composed of the NAND gate circuit NA11-1 and the inverter IV11-1 can be reduced.

In the sixth embodiment as described above, in the standby state and data read, the ground voltage is supplied to all word lines. Additionally, the power supply voltage is supplied to all select lines on the source line side in the standby state. Accordingly, the voltages of the word lines do not vary by the influence of voltage variations of the select lines on the source line side. This stabilizes the voltage of the gate electrode of the memory cell and improves the access time required for reading data.

The sixth embodiment has been explained by taking a 3-transistor NAND flash memory as an example. However, this sixth embodiment is not limited to a 3-transistor NAND flash memory and a NAND EEPROM having a plurality of memory cells but is also applicable to other nonvolatile memories having select lines, e.g., a common AND flash EEPROM and DINOR flash EEPROM.

Seventh Embodiment

The seventh embodiment as another modification of the fifth embodiment will be described below.

Figure 24:
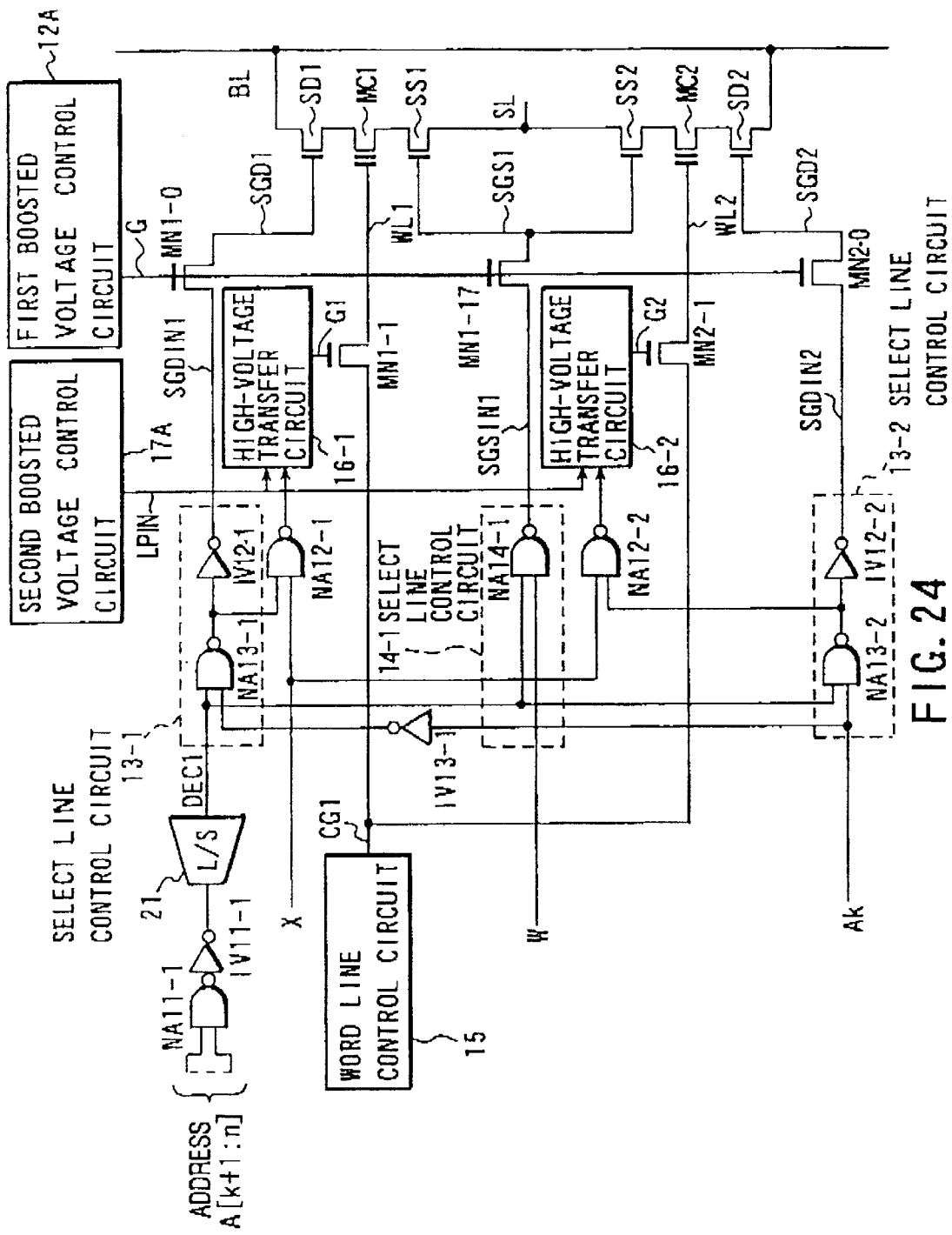
FIG. 24 is a circuit diagram showing the arrangement of a semiconductor memory according to a seventh embodiment of the present invention.

FIG. 24 is a circuit diagram showing the arrangement of a semiconductor memory according to this seventh embodiment of the present invention. FIG. 24 shows select line control circuits of two blocks and shows only one bit line as a memory cell array. This seventh embodiment is obtained by adding a level shifter 21 between the address decoding circuit and the select line control circuits and high-voltage transfer circuits, i.e., between the inverter IV11-1 and the NAND gate circuit NA13-1 in the sixth embodiment shown in FIG. 22. After a row address except for a least significant address Ak is decoded, this level shifter 21 shifts the level of the power supply to a boosted voltage Vsg higher than a power supply voltage Vdd. The rest of the arrangement is the same as the sixth embodiment shown in FIG. 22.

The circuit configuration will be described below with reference to the first block. FIG. 25 shows input and output signals (a decode signal S1 and a gate line G1) of a high-voltage transfer circuit 16-1 in a block C1 in different operating states. In the standby state and data read, the decode signal S1 (the boosted voltage Vsg) whose level has been shifted is supplied from the high-voltage transfer circuit 16-1 to a gate line G1. This makes the gate voltage of a transfer transistor MN1-1 higher than the power supply voltage Vdd and lowers the resistance of this transfer transistor MN1-1, thereby increasing the driving force of transferring the ground voltage to a word line WLi. As a consequence, in the data read operation, a voltage variation of a word line in a selected block decreases, so the voltage of the word line can be rapidly recovered to the ground voltage.

Also, even when this semiconductor memory has a low operating power-supply voltage, high voltages can be transferred to the gate electrodes of select transistors SD1 and SS1 via transfer transistors MN1-0 and MN1-17, respectively. Hence, it is possible to lower the resistance of these select transistors and increase the circuit operation speed, particularly the access time required for reading data.

In the seventh embodiment as described above, a level shifter is inserted between the address decoding circuit and the select line control circuits and high-voltage transfer circuits. This level shifter raises the gate voltage of transistors for transferring voltages to word lines and thereby lowers the resistance of these transistors. In a precharge sequence and recovery sequence of data read, therefore, it is possible to rapidly recover the word lines to the ground voltage and improve the access time required for reading data. In addition, in the standby state and data read, the ground voltage is supplied to all word lines, and the power supply voltage (when a level shifter is used, a boosted voltage higher than the power supply voltage) is supplied to all select lines on the source line side in the standby state. Accordingly, the voltage of the word lines does not vary by the influence of voltage variations of the select lines. This stabilizes the voltage of the gate electrode of the memory cell and improves the access time required for reading data.

The seventh embodiment has been explained by taking a 3-transistor NAND flash memory as an example. However, this seventh embodiment is not limited to a 3-transistor NAND flash memory and a NAND EEPROM having a plurality of memory cells but is also applicable to other nonvolatile memories having select lines, e.g., a common AND flash EEPROM and DINOR flash EEPROM.

The semiconductor memories of the fifth to seventh embodiments have the following effects. That is, it is possible to stabilize the word line voltage and increase and standardize the access time required for reading data.

In a voltage transfer transistor whose source is connected to a word line, it is possible to reduce a substrate current generated because a p-n junction formed by the source diffusion layer and the substrate is forward biased, thereby reducing current consumption. As the integration and scale down of LSIs advance in the future, the substrate current increases, and the resistance to latch-up leading to chip destruction reduces. In these embodiments, however, a high latch-up resistance can be ensured.

The initial voltages of word lines at the beginning of a data read operation can be standardized. This facilitates designing circuits related to the read operation.

In the fifth to seventh embodiments as described above, a high latch-up resistance can be ensured, and high-speed read is possible with low current consumption. Also, a 3-transistor NAND flash memory has no unselected memory cells unlike in a NAND flash memory having a plurality of memory cells connected in series. In a data read operation, therefore, transfer transistors of word lines need not transfer the read voltage (about 3.5 V) which has been transferred to unselected memory cells, i.e., need only transfer the ground voltage to these word lines. This obviates the need to supply a boosted voltage of 6 V to the gates of the word line transfer transistors. Accordingly, it is possible to downsize a boosting circuit and its control circuit and thereby reduce the circuit area.

As has been described above, the present invention can provide a semiconductor memory capable of suppressing current consumption, rapidly supplying voltages to select lines, and increasing the rate of a read operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell for storing information;
   a select transistor connected to said memory cell;
   a select circuit for outputting a first signal for selecting said memory cell;
   a select line connected the gate of said select transistor;
   a select line control circuit for driving said select transistor, said select line control circuit outputting a second signal in accordance with said first signal and a operation mode of said memory cell;
   a first transistor having a current path whose one end is connected to said select line control circuit and other end is connected to the gate of said select transistor, said first transistor transferring the second signal to said select line;
   a first gate line connected to the gate of said first transistor;
   a first voltage control circuit for supplying a voltage to said first gate line to turn on or off said first transistor;
   a word line control circuit for driving a word line connected to the gate of said memory cell, said word line control circuit outputting a third signal;
   a second transistor having a current path whose one end is connected to said word line control circuit and other end is connected to the word line, said second transistor transferring the third signal to the word line;
   a second gate line connected to the gate of said second transistor, said second gate line being disconnected from said first gate line; and
   a second voltage control circuit for supplying a voltage to said second gate line to turn on or off said second transistor.

2. A memory according to claim 1, wherein in data erase, said first voltage control circuit supplies a voltage not more than a power supply voltage to said first gate line.

3. A memory according to claim 1, wherein in any of data read, data programming, and a read standby state, said first voltage control circuit supplies a voltage higher than a power supply voltage to said first gate line.

4. A memory according to claim 1, further comprising:
   a bit line connected to said select transistor; and
   a third transistor having a current path whose one end is connected to said bit line and other end is connected to a sense amplifier for sensing the voltage of said bit line to perform a data read operation, the gate of said third transistor being connected to said first gate line connected to the gate of said first transistor.

5. A memory according to claim 1, wherein data is erased by applying a high erase voltage to a well in which said memory cell is formed.

6. A memory according to claim 1, wherein in a data read standby state and data read, a read voltage is supplied to all word lines connected to the control gate of said memory cell.

7. A memory according to claim 1, wherein
   in a data read standby state and data read, said second voltage control circuit turns on said second transistors connected to all word lines connected to the control gate of said memory cell, and causes said word line control circuit to supply a read voltage to all of said word lines, and
   in a state except for the data read standby state and data read, said second voltage control circuit turns on said second transistor connected to a selected word line to transfer a voltage supplied from said word line control circuit to said selected word line, and turns off said second transistor connected to an unselected word line so as not to transfer the voltage supplied from said word line control circuit to said unselected word line.

8. A memory according to claim 7, wherein in the data read standby state and data read, said second voltage control circuit supplies to said second gate line a voltage by which said second transistor is turned on.

9. A memory according to claim 7, wherein
   in a state except for the data read standby state and data read, the operation of said second voltage control circuit is controlled by a signal obtained by decoding an address signal for selecting said memory cell, said second voltage control circuit related to a selected memory cell supplies to said second gate line pertaining to said selected memory cell a voltage by which said second transistor related to said selected memory cell is turned on, and said second voltage control circuit related to an unselected memory cell supplies to said second gate line pertaining to said unselected memory cell a voltage by which said second transistor related to said unselected memory cell is turned off.

10. A memory according to claim 1, further comprising a logic circuit connected between said select circuit and said second voltage control circuit, wherein said logic circuit receives an address decode signal as the first signal for selecting said memory cell and control signal, and outputs to said second voltage control circuit a signal for controlling the operation of said second voltage control circuit.

11. A memory according to claim 1, further comprising a level shifting circuit connected between said selecting circuit and said second voltage control circuit to convert a voltage.

12. A memory according to claim 1, further comprising a level shifting circuit connected between said selecting circuit and said select line control circuit to convert a voltage.

13. A memory according to claim 1, wherein in a data read standby state and data read, a voltage supplied to a word line connected to the control gate of said memory cell is not less than a ground voltage.

14. A memory according to claim 1, wherein the film thickness of a gate insulating film of a transistors constituting said select circuit and said select line control circuit is smaller than that of said first transistor.

15. A memory according to claim 1, wherein said memory cell is a nonvolatile memory cell.

16. A semiconductor memory device comprising:

a memory cell array in which memory cell blocks are arrayed in a column direction, each of said memory cell blocks being formed by arranging memory cell units in a row direction, and each of said memory cell units being formed by connecting a select transistor to a memory cell for storing information;

a select circuit for outputting a first signal for selecting each of said memory cell blocks;

a select line connected the gate of said select transistor;

a select line control circuit for driving said select transistor, said select line control circuit outputting a second signal in accordance with said first signal and a operation mode of said memory cell;

a first transistor having a current path whose one end is connected to said select line control circuit and other end is connected to the gate of said select transistor, said first transistor transferring the second signal to said select line;

a first gate line connected to the gate of said first transistor;

a first voltage control circuit for supplying a voltage to said first gate line to turn on or off said first transistor;

a word line control circuit for driving a word line connected to the gate of said memory cell in said memory cell unit, said word line control circuit outputting a third signal;

a second transistor having a current path whose one end is connected to said word line control circuit and other end is connected to the word line, said second transistor transferring the third signal to the word line;

a second gate line connected to the gate of said second transistor, said second gate line being disconnected from said first gate line; and a second voltage control circuit for supplying a voltage to said second gate line to turn on or off said second transistor.

17. A memory according to claim 16, wherein said memory cell comprises one transistor.

18. A memory according to claim 16, wherein in data erase, said first voltage control circuit supplies a voltage not more than a power supply voltage to said first gate line.

19. A memory according to claim 16, wherein in any of data read, data programming, and a read standby state, said first voltage control circuit supplies a voltage higher than a power supply voltage to said first gate line.

20. A memory according to claim 16, further comprising:

a bit line connected to said select transistor; and a third transistor having a current path whose one end is connected to said bit line and other end is connected to a sense amplifier for sensing the voltage of said bit line to perform a data read operation, the gate of said third transistor being connected to said first gate line connected to the gate of said first transistor.

21. A memory according to claim 16, wherein data is erased by applying a high erase voltage to a well in which said memory cell is formed.

22. A memory according to claim 16, wherein in a data read standby state and data read, a read voltage is supplied to all word lines connected to the control gate of said memory cell.

23. A memory according to claim 16, further comprising a logic circuit connected between said select circuit and said second voltage control circuit, wherein said logic circuit receives an address decode signal as the first signal for selecting said memory cell and control signal, and outputs to said second voltage control circuit a signal for controlling the operation of said second voltage control circuit.

24. A memory according to claim 16, further comprising a level shifting circuit connected between said selecting circuit and said select line control circuit to convert a voltage.

25. A memory according to claim 16, wherein the film thickness of a gate insulating film of a transistors constituting said select circuit and said select line control circuit is smaller than that of said first transistor.

26. A semiconductor memory device comprising:

a memory cell array in which memory cell units are arrayed in a matrix manner, each of said memory cell units being formed by connecting select transistors to two ends of one memory cell transistor for storing information, a bit line being connected to a select transistor connected to one end of said memory cell unit, and a source line being connected to a select transistor connected to the other end of said memory cell unit;

a select circuit for outputting a first signal for selecting each of said memory cell units arrayed in a row direction;

a select line connected each of the gates of said select transistors;

a select line control circuit for driving at least one of said select transistors, said select line control circuit outputting a second signal in accordance with said first signal and a operation mode of said memory cell;

a first transistor having a current path whose one end is connected to said select line control circuit and other end is connected to the gate of at least one of said select transistors, said first transistor transferring the second signal to said select line;

a first gate line connected to the gate of said first transistor;

a first voltage control circuit for supplying a voltage to said first gate line to turn on or off said first transistor;

a word line control circuit for driving a word line connected to the gate of said memory cell in each of said memory cell units arrayed in the row direction, said word line control circuit outputting a third signal;

a second transistor having a current path whose one end is connected to said word line control circuit and other end is connected to the word line, said second transistor transferring the third signal to the word line;

a second gate line connected to the gate of said second transistor, said second gate line being disconnected from said first gate line; and a second voltage control circuit for supplying a voltage to said second gate line to turn on or off said second transistor.

27. A memory according to claim 26, wherein in data programming, a voltage lower than a power supply voltage is supplied only to the gate of said select transistor close to said source line related to a selected one of said memory cell units arrayed in a matrix manner, and in a mode other than data programming, a voltage not less than the power supply voltage is supplied only to the gate of said select transistor close to said source line.

28. A memory according to claim 26, wherein at least one of said select lines connected to the gates of said select transistors in each of said memory cell units is connected to the gate of one of said select transistors in an adjacent one of said memory cell units.

29. A memory according to claim 26, wherein in data erase, said first voltage control circuit supplies a voltage not more than a power supply voltage to said first gate line.

30. A memory according to claim 26, wherein in any of data read, data programming, and a read standby state, said first voltage control circuit supplies a voltage higher than a power supply voltage to said first gate line.

31. A memory according to claim 26, further comprising:

a bit line connected to said select transistor; and a third transistor having a current path whose one end is connected to said bit line and other end is connected to a sense amplifier for sensing the voltage of said bit line to perform a data read operation, wherein the gate of said third transistor is connected to said first gate line connected to the gate of said first transistor.

32. A memory according to claim 26, wherein data is erased by applying a high erase voltage to a well in which said memory cell is formed.

33. A memory according to claim 26, wherein in a data read standby state and data read, a read voltage is supplied to all word lines connected to the control gate of said memory cell.

34. A memory according to claim 26, further comprising a logic circuit connected between said selecting circuit and said second voltage control circuit, wherein said logic circuit receives an address decode signal and control signal as the first signal for selecting said memory cell, and outputs to said second voltage control circuit a signal for controlling the operation of said second voltage control circuit.

35. A memory according to claim 26, further comprising a level shifting circuit connected between said select circuit and said select line control circuit to convert a voltage.

36. A memory according to claim 26, wherein the film thickness of a gate insulating film of a transistors constituting said select circuit and said select line control circuit is smaller than that of said first transistor.

37. A semiconductor memory device comprising:

a memory cell for storing information;

a select transistor connected to said memory cell;

a select line control circuit for driving said select transistor;

a first transistor having a current path whose two ends are connected between said select line control circuit and the gate of said select transistor;

a first gate line connected to the gate of said first transistor;

a first voltage control circuit for supplying a voltage to said first gate line to turn on or off said first transistor;

a word line control circuit for driving a word line connected to the gate of said memory cell;

a second transistor having a current path whose two ends are connected between said word line control circuit and the word line;

a second gate line connected to the gate of said second transistor, said second gate line being disconnected from said first gate line; and a second voltage control circuit for supplying a voltage to said second gate line to turn on or off said second transistor.

38. A memory according to claim 37, wherein in data erase, said first voltage control circuit supplies a voltage not more than a power supply voltage to said first gate line.

39. A memory according to claim 37, wherein in any of data read, data programming, and a read standby state, said first voltage control circuit supplies a voltage higher than a power supply voltage to said first gate line.

* * * * *